United States Patent
Goldenberg et al.

(10) Patent No.: US 10,567,001 B2
(45) Date of Patent: *Feb. 18, 2020

(54) METHOD AND DATA STORAGE DEVICE TO ESTIMATE A NUMBER OF ERRORS USING CONVOLUTIONAL LOW-DENSITY PARITY-CHECK CODING

(71) Applicant: SANDISK TECHNOLOGIES LLC, Addison, TX (US)

(72) Inventors: Idan Goldenberg, Ramat Hasharon (IL); Ishai Ilani, Dolev (IL); Alexander Bazarsky, Holon (IL); Rami Rom, Zichron-Yaakov (IL)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/049,069

(22) Filed: Jul. 30, 2018

(65) Prior Publication Data
US 2018/0351576 A1    Dec. 6, 2018

Related U.S. Application Data

(63) Continuation of application No. 15/265,045, filed on Sep. 14, 2016, now Pat. No. 10,063,258, which is a
(Continued)

(51) Int. Cl.
H03M 13/11    (2006.01)
H03M 13/37    (2006.01)
(Continued)

(52) U.S. Cl.
CPC ......... *H03M 13/1154* (2013.01); *G06F 11/10* (2013.01); *G06F 11/1012* (2013.01);
(Continued)

(58) Field of Classification Search
CPC ......... H03M 13/1154; H03M 13/1105; H03M 13/3715; H03M 13/3723; H03M 13/612;
(Continued)

(56) References Cited

U.S. PATENT DOCUMENTS 8,028,216 B1    9/2011 Yeo et al.
8,549,384 B1    10/2013 Huang et al.
(Continued)

FOREIGN PATENT DOCUMENTS

WO    WO 2015/191245 A1    12/2015

OTHER PUBLICATIONS

International Search Report and Written Opinion dated May 29, 2017 in International Application No. PCT/ US2017/019465, 23 pages.
(Continued)

*Primary Examiner* — Kyle Vallecillo
(74) *Attorney, Agent, or Firm* — Michael Best & Friedrich LLP

(57) ABSTRACT

In an illustrative example, a method includes sensing at least a portion of a representation of a convolutional low-density parity-check (CLDPC) codeword stored at a memory of a data storage device. The method further includes receiving the portion of the representation of the CLDPC codeword at a controller of the data storage device. The method further includes performing one or more management operations associated with the memory based on an estimated number of errors of the portion of the representation of the CLDPC codeword.

29 Claims, 9 Drawing Sheets

Related U.S. Application Data continuation-in-part of application No. 15/179,069, filed on Jun. 10, 2016, now Pat. No. 10,367,528.

(60) Provisional application No. 62/303,768, filed on Mar. 4, 2016.

(51) Int. Cl.
*H03M 13/00* (2006.01)
*G06F 11/10* (2006.01)
*H03M 13/35* (2006.01)

(52) U.S. Cl.
CPC ..... *G06F 11/1076* (2013.01); *H03M 13/1105* (2013.01); *H03M 13/3715* (2013.01); *H03M 13/3723* (2013.01); *H03M 13/612* (2013.01); *H03M 13/6325* (2013.01); *G06F 11/106* (2013.01); *G06F 11/1052* (2013.01); *G06F 11/1072* (2013.01); *H03M 13/1108* (2013.01); *H03M 13/353* (2013.01)

(58) Field of Classification Search
CPC ......... H03M 13/6325; H03M 13/1108; H03M 13/353; G06F 11/10; G06F 11/1076; G06F 11/1052; G06F 11/106; G06F 11/1072

See application file for complete search history.

(56) References Cited

U.S. PATENT DOCUMENTS

| | | | |
|---|---|---|---|
| 8,645,789 | B2 | 2/2014 | Sharon et al. |
| 8,924,815 | B2 | 12/2014 | Frayer et al. |
| 9,032,269 | B2 | 5/2015 | Sharon et al. |
| 9,674,021 | B2 | 6/2017 | Mun et al. |
| 2007/0060061 | A1 | 3/2007 | Sampath |
| 2008/0310554 | A1 | 12/2008 | Siti et al. |
| 2009/0125764 | A1 | 5/2009 | Sun et al. |
| 2010/0111160 | A1 | 5/2010 | Siti |
| 2013/0024735 | A1* | 1/2013 | Chung ............... G06F 11/1048 714/704 |
| 2013/0132804 | A1 | 5/2013 | Frayer et al. |
| 2013/0145238 | A1 | 6/2013 | Alhussien et al. |
| 2014/0068370 | A1 | 3/2014 | Murakami et al. |
| 2014/0082459 | A1* | 3/2014 | Li ....................... G06F 11/1666 714/773 |
| 2014/0173382 | A1 | 6/2014 | Yang et al. |
| 2016/0087649 | A1 | 3/2016 | Limberg |
| 2017/0257117 | A1 | 9/2017 | Goldenberg et al. |
| 2017/0257118 | A1 | 9/2017 | Goldenberg et al. |

OTHER PUBLICATIONS

Costello et al., "Spatially Coupled Sparced Codes on Graphs: Theory and Practice," IEEE Communications Magazine, Jul. 2014, pp. 168-176.

Lentmaier et al., "Iterative Decoding Threshold Analysis for LDPC Convolutional Codes," IEEE Transactions on Information Theory, vol. 56, No. 10, Oct. 2010, pp. 5274-5289.

Ravimohan et al., "Partial Soft Bit Read," U.S. Appl. No. 14/927,088, filed Oct. 29, 2015, 38 pgs.

Ryabinin et al., "Storage Device Operations Based on Bit Error Rate (BER) Estimate," U.S. Appl. No. 14/925,676, filed Oct. 28, 2015, 37 pages.

Felstrom et al., "Time-varying Periodic Convolutional Codes with Low-density Parity-check Matrices," IEEE Transactions on Information Theory, vol. 45, No. 6, Sep. 1999, pp. 2181-2191.

Iyengar et al., "Windowed Decoding of Photograph-based LDPC Convolutional Codes over Erasure Channels," IEEE Transactions on Information Theory, vol. 58, No. 4, Apr. 2012, 18 pages.

Kudekar et al., "Threshold Saturation via Spatial Coupling: Why Convolutional LDPC Ensembles Perform so Well over the BEC," IEEE Transactions on Information Theory, vol. 57, No. 2, Feb. 2011, 29 pages.

* cited by examiner

METHOD AND DATA STORAGE DEVICE TO ESTIMATE A NUMBER OF ERRORS USING CONVOLUTIONAL LOW-DENSITY PARITY-CHECK CODING

CROSS-REFERENCE TO RELATED APPLICATIONS

The present application claims benefit of U.S. Provisional Application No. 62/303,768, filed Mar. 4, 2016, and further claims benefit of and is a continuation of U.S. patent application Ser. No. 15/265,045, filed Sep. 14, 2016, which is a continuation-in-part of U.S. patent application Ser. No. 15/179,069, filed Jun. 10, 2016, the contents of which applications are incorporated by reference herein in their entirety.

FIELD OF THE DISCLOSURE

The present disclosure is generally related to electronic devices and more particularly to convolutional low-density parity-check coding for an electronic device.

BACKGROUND

Storage devices enable users to store and retrieve data. Examples of storage devices include volatile memory devices and non-volatile memory devices. A non-volatile memory may retain data after a power-down event, and a volatile memory may lose data after a power-down event.

Data written to and read from a storage device may be subject to one or more errors. For example, electronic noise may affect a storage element of a storage device and may cause the storage element to indicate an "incorrect" state.

Storage devices may use error correction coding (ECC) techniques to increase reliability of stored data. For example, an ECC technique may specify that redundancy information is to be added to data to generate a codeword prior to storing the data at a memory. During a read process to read the data, the redundancy information may be used to correct one or more errors of the codeword (up to an error correction capability associated with the ECC technique).

Certain ECC techniques provide a relatively high level of error correction capability. For example, by using a relatively large amount of redundancy information, error correction capability may be increased. Increasing an amount of redundancy information may affect data decoding throughput and data storage density. For example, in some cases, increasing the amount of redundancy may increase throughput due to increased speed of decoding operations, and in other cases increasing the amount of redundancy may decrease throughput due to additional computations associated with the redundancy information. Further, increasing a number of linear equations associated with a codeword (in order to generate additional redundancy information) may complicate certain encoding and/or decoding operations (e.g., the ECC technique may not be relatively "encodeable"). Other ECC techniques may increase decoding throughput and data storage density by reducing an amount of redundancy information. In some circumstances, a number of errors may exceed an error correction capability associated with an ECC technique, which may result in an uncorrectable error correcting code (UECC) error and data loss.

DETAILED DESCRIPTION

Figure 1:
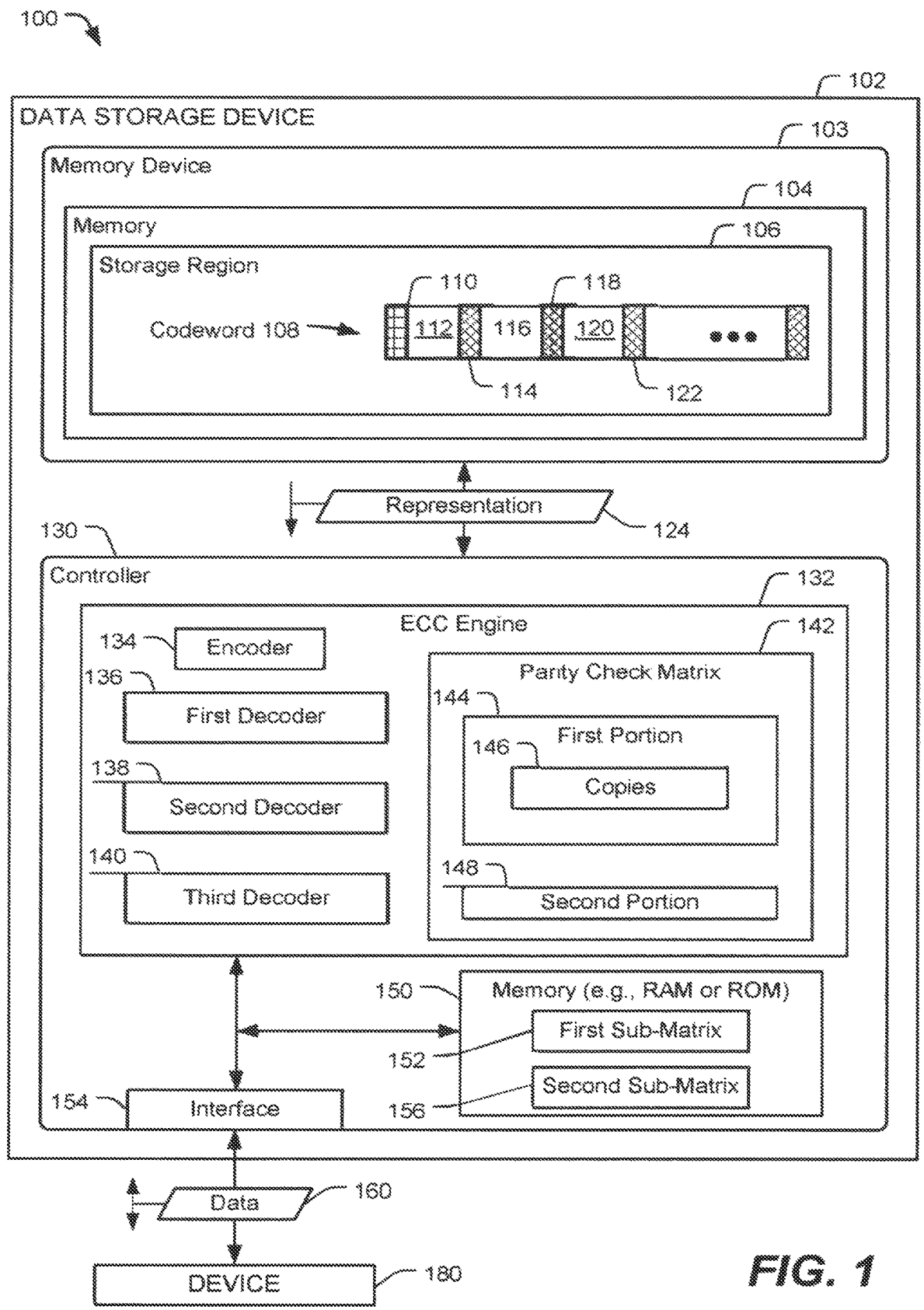
FIG. 1 is a diagram of a particular illustrative example of a system including a data storage device that is configured to operate based on a convolutional low-density parity-check (CLDPC) code.

Aspects of a convolutional low-density parity-check (CLDPC) code are disclosed to enable high decoding throughput and encodeability while also achieving a relatively high error correction capability. In a first example, a parity check matrix of the CLDPC code includes a plurality of copies of a sub-matrix forming a first portion of the parity check matrix. Use of a plurality of copies of a sub-matrix to form the first portion of the parity check matrix may simplify device operation. For example, the sub-matrix may correspond to a low-complexity code that is "shrunk" (to a size of a sub-matrix) and then repeated (instead of constructing a "full" matrix to create the first portion). The parity check matrix may further include a second portion (e.g., a "tail" or a "terminating" portion). The second portion may increase encodeability of the parity check matrix, such as by diagonalizing the parity check matrix. In an illustrative implementation, a windowed CLDPC decoding process includes decoding portions of a CLDPC codeword using windows (e.g., non-overlapping subsets) of the parity check matrix in parallel to increase decoding throughput.

Alternatively or in addition to the first example, a windowed CLDPC decoding process according to a second example uses multiple decoders having different window sizes. For example, the multiple decoders may include a first decoder associated with a first power consumption, a second decoder associated with a second power consumption that is greater than the first power consumption, and a third decoder that is associated with a third power consumption that is greater than the second power consumption. A data size of a memory accessed by the multiple decoders may be selected based on the third decoder (e.g., based on a number of soft bits used by the third decoder). As a result, memory space of the memory may be "unused" during operation of the first decoder and the second decoder. A size of a first window used by the first decoder and/or a size of a second window used by the second decoder may be increased as compared to a size of a third window of the third decoder.

Alternatively or in addition to the first example and the second example, a CLDPC codeword according to a third example may include error correction information at certain "check points" of the CLDPC codeword. Portions of the CLDPC codeword may be decoded using the error correction information and may be sent to a device in a serial manner. For example, decoding of the CLDPC codeword may be performed in a pipelined manner, and each portion of the CLDPC codeword may be provided separately to the device upon decoding.

Alternatively or in addition to the first example, the second example, and the third example, a portion of a CLDPC codeword may be accessed according to a fourth example. An estimated number of errors may be determined based on the portion (e.g., a subset) of the CLDPC codeword. For example, the estimated number of errors may correspond to a bit error rate (BER). The estimated number of errors may be used in connection with a management operation, such as a memory management operation or a health management operation, as illustrative examples. Alternatively or in addition, the estimated number of errors may be used in connection with decoding of the CLDPC codeword. In some circumstances, using a portion of the CLDPC codeword (instead of the full CLDPC codeword) may reduce an amount of information sent between a controller and a memory and may reduce an amount of time used to estimate a BER.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. As an illustrative example, CLDPC techniques may be utilized to improve reliability of wired or wireless communications. Those of skill in the art will recognize that techniques described herein are applicable to other implementations.

Further, although certain aspects as described concurrently with reference to FIG. 1, it should be appreciated that in some implementations a device may operate according to a subset of aspects described with reference to FIG. 1. In addition, although certain examples (e.g., examples of FIG. 1 and FIG. 10) are described separately for convenience, it is noted that aspects described herein may be combined without departing from the scope of the disclose.

Referring to FIG. 1, a particular illustrative example of system is depicted and generally designated 100. The system 100 includes a data storage device 102 and a device 180 (e.g., a host device or an access device). The data storage device 102 includes a memory device 103 and a controller 130. The controller 130 is coupled to the memory device 103.

The memory device 103 includes a memory 104, such as a non-volatile array of storage elements included in one or more memory dies. The memory 104 may include a flash memory (e.g., a NAND flash memory) or a resistive memory, such as a resistive random access memory (ReRAM), as illustrative examples.

The memory 104 includes one or more regions of storage elements, such as a storage region 106. An example of the storage region 106 is a block, such as a NAND flash erase group of storage elements, or a group of resistance-based storage elements in a ReRAM implementation. Another example of the storage region 106 is a word line of storage elements (e.g., a word line of NAND flash storage elements or a word line of resistance-based storage elements). The storage region 106 may have a single-level-cell (SLC) configuration, a multi-level-cell (MLC) configuration, or a tri-level-cell (TLC) configuration, as illustrative examples. Each storage element of the storage region 106 may be programmable to a state (e.g., a threshold voltage in a flash configuration or a resistive state in a resistive memory configuration) that indicates one or more values. As an example, in an illustrative TLC scheme, a storage element of the storage region 106 may be programmable to a state that indicates three values. As an additional example, in an illustrative MLC scheme, a storage element of the storage region 106 may be programmable to a state that indicates two values.

The controller 130 may include an error correcting code (ECC) engine 132, a memory 150 coupled to the ECC engine 132, and an interface 154 (e.g., a host interface or an access device interface). The memory 150 may include a random access memory (RAM), a read-only memory (ROM), another memory, or a combination thereof. The interface 154 is configured to receive data 160 from the device 180 in connection with a request for write access to the memory 104. The interface 154 is configured to provide the data 160 to the device 180 in connection with a request for read access to the memory 104.

The ECC engine 132 may include one or more encoders, such as an encoder 134. The ECC engine 132 may include one or more decoders, such as a first decoder 136, a second decoder 138, and a third decoder 140. In an illustrative example, the first decoder 136 is coupled to the second decoder 138 (e.g., an output of the first decoder 136 may be coupled to an input of the second decoder 138), and the second decoder 138 is coupled to the third decoder 140 (e.g., an output of the second decoder 138 may be coupled to an input of the third decoder 140). In another implementation, the output of the first decoder is not coupled to the input of the second decoder, such as if the second decoder 138 is configured to receive data to be decoded from the memory device 103 (instead of from the first decoder 136). Although the example of FIG. 1 illustrates three decoders, it should be appreciated that in other implementations the ECC engine 132 may include a different number of decoders, such as one decoder, two decoders, four decoders, or another number of decoders.

The ECC engine 132 is configured to operate based on a convolutional low-density parity-check (CLDPC) code. For example, the ECC engine 132 may be configured to process the data 160 based on a parity check matrix 142 associated with a CLDPC code. The parity check matrix 142 may include a first portion 144 and a second portion 148. The first portion 144 may include a plurality of copies 146 of a first sub-matrix 152 that is associated with a first sub-code (e.g., a systematic sub-code) of a CLDPC code, and the second portion 148 may include at least one copy of a second sub-matrix 156 that is associated with a second sub-code of the CLDPC code. FIG. 1 illustrates that the memory 150 may be configured to store a copy of the first sub-matrix 152 and a copy of the second sub-matrix 156.

During operation, the controller 130 may receive the data 160 from the device 180. The controller 130 may process the data 160 in accordance with a CLDPC code. For example, controller 130 may input the data 160 to the ECC engine 132 to be encoded by the encoder 134 to generate one or more codewords associated with the CLDPC code, such as a codeword 108. The encoder 134 may be configured to encode the data 160 based on the parity check matrix 142 or based on another matrix that is associated with the parity check matrix 142 (e.g., based on a generator matrix that is based on the parity check matrix 142).

In some implementations, the encoder 134 is configured to insert one or more check point portions in the codeword 108 in connection with an encoding process. For example, the encoder 134 may be configured to insert a first check point portion 114 between a first data portion 112 and a second data portion 116. As another example, the encoder 134 may be configured to insert a second check point portion 118 between the second data portion 116 and a third data portion 120. As an additional example, the encoder 134 may be configured to insert a third check point portion 122 after the third data portion 120. FIG. 1 also depicts that the codeword 108 may include metadata, such as a header 110.

In an illustrative example, the first check point portion 114 includes first error correcting information (or first error detecting information), such as a first cyclic redundancy check (CRC) associated with the header 110 and the first data portion 112. The second check point portion 118 may include second error correcting information (or second error detecting information), such as a second CRC associated with the second data portion 116. The third check point portion 122 may include third error correcting information, such as a third CRC associated with the third data portion 120.

The controller 130 may send the one or more codewords to the memory device 103 to be stored at the memory 104, and the memory 104 is configured to store the one or more codewords. For example, the controller 130 may send a write command to cause the memory device 103 to store the codeword 108 to the storage region 106.

The controller 130 may cause the memory device 103 to access a representation of the codeword 108, such as in response to a request for read access from the device 180. The controller 130 may send a read command to cause the memory device 103 to sense a representation 124 of the codeword 108 (e.g., a version of the codeword 108 that may differ from the codeword 108 due to one or more errors). The memory device 103 may provide the representation 124 of the codeword 108 to the controller 130.

The controller 130 may input the representation 124 of the codeword 108 to the ECC engine 132 to initiate a decoding process. For example, one or more of the decoders 136, 138, and 140 may perform one or more operations of the decoding process. One or more of the decoders 136, 138, and 140 may be configured to decode the representation 124 of the codeword 108 based on the parity check matrix 142.

In an illustrative implementation, the decoders 136, 138, and 140 are configured to operate using a windowed decoding process. The windowed decoding process may include decoding a portion of the representation 124 based on a corresponding window (e.g., subset of rows and columns) of the parity check matrix 142.

To further illustrate, the first decoder 136 may be configured to perform a first decoding operation based on a first window W1 of the parity check matrix 142. The first window W1 may correspond to a first subset of rows and columns of the parity check matrix 142, and the first decoder 136 may adjust (e.g., move or "slide") the first window W1 to select another subset of rows and columns of the parity check matrix 142.

In an illustrative example, the first decoder 136 decodes a first data portion of the representation 124 (e.g., the first data portion 112) in connection with the first decoding operation. The second decoder 138 may be configured to perform a second decoding operation based on a second window W2 of the parity check matrix 142, and the third decoder 140 may be configured to perform a third decoding operation based on a third window W3 of the parity check matrix 142. In an illustrative example, the second decoder 138 decodes a second data portion of the representation 124 (e.g., the second data portion 116) in connection with the second decoding operation, and the third decoder 140 decodes a third data portion of the representation 124 (e.g., the third data portion 120) in connection with the third decoding operation. The first window W1 may have a first size that is greater than a second size of the second window W2, and the third window W3 may have a third size that is less than the second size of the second window W2. The second window W2 may correspond to a second subset of rows and columns of the parity check matrix 142, and the second decoder 138 may adjust (e.g., move or "slide") the second window W2 to select another subset of rows and columns of the parity check matrix 142. The third window W3 may correspond to a second subset of rows and columns of the parity check matrix 142, and the third decoder 140 may adjust (e.g., move or "slide") the third window W3 to select another subset of rows and columns of the parity check matrix 142.

As used herein, a windowed decoding operation may use a subset of the parity check matrix 142 to decode a data portion having a data size corresponding to (e.g., equal to) a size of the subset. For example, a first data size (e.g., a first number of bits) of a first data portion decoded by the first decoder 136 may correspond to a first size of the first window W1. As additional examples, a second data size (e.g., a second number of bits) of a second data portion decoded by the second decoder 138 may correspond to a second size of the second window W2, and a third data size (e.g., a third number of bits) of a third data portion decoded by the third decoder 140 may correspond to a third size of the third window W3.

In an illustrative example, operation of the first decoder 136 is associated with a first power consumption, operation of the second decoder 138 is associated with a second power consumption that is greater than the first power consumption, and operation of the third decoder 140 is associated with a third power consumption that is greater than the second power consumption. To illustrate, the first decoder 136 may use a first number of soft bits (e.g., zero soft bits or one soft bit, as illustrative examples) for each bit of the representation 124 during message passing between check nodes and variable nodes of the first decoder 136. The second decoder 138 may use a second number of soft bits (e.g., three soft bits, as an illustrative example) that is greater than the first number, and the third decoder 140 may use a third number of soft bits (e.g., five soft bits, as an illustrative example) that is greater than the second number. In this example, operation of the first decoder 136 may consume less power than operation of the second decoder 138, and operation of the second decoder 138 may consume less power than operation of the third decoder 140.

In an illustrative example, a data size (e.g., a memory capacity) of the memory 150 is selected based on a message size of the third decoder 140. For example, because a size of messages passed between variable nodes and check nodes of the third decoder 140 may be greater than sizes of messages used by the first decoder 136 and the second decoder 138, the data size of the memory 150 may be selected based on the message size of the third decoder 140 instead of based on the first decoder 136 or the second decoder 138.

In some implementations, the ECC engine 132 is configured to perform one or more decoding operations concurrently. For example, the first decoder 136 may perform a first decoding operation in parallel with a second decoding operation performed by the second decoder 138. In this example, the first window W1 may be non-overlapping relative to the second window W2. Alternatively or in addition, the first decoder 136 may perform the first decoding operation in parallel with a third decoding operation performed by the third decoder 140. In this example, the first window W1 may be non-overlapping relative to the third window W3. Alternatively or additionally, windowing of the first decoding operation may be performed in one direction (e.g., from left to right using a "forward" windowed decoding process), and windowing of the second decoding operation may be performed in the opposite direction (e.g., from right to left using a "reverse" windowed decoding process).

In another example, one or more of the second decoder 138 or the third decoder 140 may be configured to retry the first decoding operation in response to detecting a failure of the first decoding operation by the first decoder 136. For example, if the first decoder 136 is unable to successfully decode the first data portion 112 based on the first number of soft bits and the first power consumption, the second decoder 138 may attempt to decode the first data portion 112 based on the second number of soft bits and the second power consumption. Further, if the second decoder 138 is unable to successfully decode the first data portion 112 (or another portion, such as the second data portion 116) based on the second number of soft bits and the second power consumption, the third decoder 140 may attempt to decode the first data portion 112 based on the third number of soft bits and the third power consumption.

If the first decoder 136 performs the first decoding operation successfully, the first decoder 136 may perform the second decoding operation in response to success of the first decoding operation by the first decoder 136. In this case, a windowed decoding process may include attempting a decoding operation using the first window W1 and may use the second window W2 and/or the third window W3 in response to decoding failure by the first decoder 136 using the first window W1.

In some implementations, the controller 130 is configured to select one or more particular portions of the codeword 108 to be selectively decoded. To illustrate, in some circumstances, the controller 130 may access metadata (e.g., the header 110) of the codeword 108, such as in response to a request for the metadata from the device 180. In this case, the controller 130 may decode the header 110 and the first data portion 112 using the first check point portion 114 to check the decoding result and may provide the header 110 to the device 180 (e.g., without providing one or more other data portions of the data 160 to the device 180).

In some implementations, the controller 130 is configured to decode portions of the representation 124 serially (e.g., using a pipelined decoding process) and to provide portions of the representation 124 to the device 180 serially. In this example, the controller 130 may provide the header 110 and the first data portion 112 to the device 180 prior to providing one or more other data portions of the data 160 to the device 180. Components of the data storage device 102 (or the system 100) may function as pipeline stages of a decoding pipeline during a pipelined decoding process. In an illustrative example, a wired or wireless connection used to transfer data from the memory device 103 to the controller 130 functions as a first pipeline stage, the ECC engine 132 functions as a second pipeline stage, and a wired or wireless connection used to transfer data from the controller 130 to the device 180 functions as a third pipeline stage. For example, the ECC engine 132 may perform decoding of a first portion of the representation 124 using the first decoder 136 and may initiate the transfer of a second portion of the representation 124 into the ECC engine 132 while decoding of the first portion is performed by the first decoder 136. By serially providing decoded data to the device 180, memory size of a RAM of the controller 130 may be conserved or reduced.

The ECC engine 132 may be configured to output the first decoded data prior to outputting the second decoded data. For example, the interface 154 may be configured to output the first decoded data prior to convergence of the second decoded data. In some implementations, the interface 154 may be configured to output the first decoded data in parallel with receiving the second portion from the memory 104.

In an illustrative implementation, the ECC engine 132 is configured to generate a representation of the parity check matrix 142 (or the first portion 144 of the parity check matrix 142) based on the first sub-matrix 152. For example, the ECC engine 132 may access a first copy of the first sub-matrix 152 (e.g., from the memory 150, such as in response to a power-up event of the data storage device 102) and may generate at least a second copy of the plurality of copies 146 based on the first copy. The ECC engine 132 may be configured to copy the first sub-matrix 152 into the first portion 144 to generate the plurality of copies 146. Alternatively or in addition, the ECC engine 132 may be configured to generate the second portion 148 based on a copy of the second sub-matrix 156 stored at the memory 150. In an illustrative example, the copies 146 correspond to transverse (or transposed) copies of the first sub-matrix 152, as described further with reference to FIG. 2.

Figure 2:
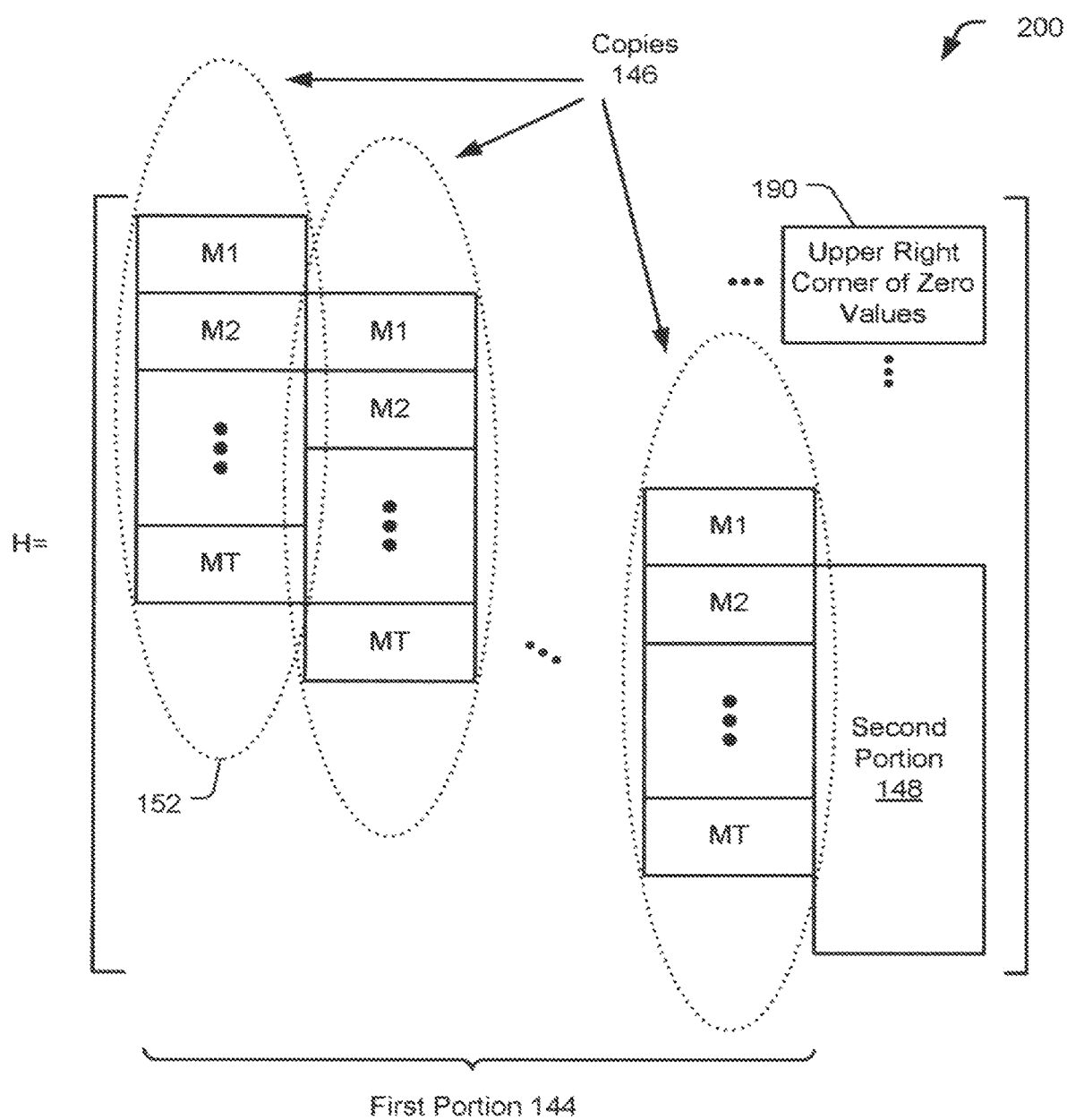
FIG. 2 is a diagram illustrating particular aspects of an example of a parity check matrix corresponding to a CLDPC code.

Referring to FIG. 2, an illustrative example of a parity check matrix is depicted and generally designated 200. The parity check matrix 200 may correspond to the parity check matrix 142 of FIG. 1. The parity check matrix 200 includes the first portion 144 and the second portion 148.

The first portion 144 includes a plurality of copies of the first sub-matrix 152. In the example of FIG. 2, the first sub-matrix 152 includes matrices M1, M2, . . . MT (e.g., a matrix "stack"). Each matrix "stack" (M1, M2, . . . MT) may correspond to another CLDPC code. In an illustrative implementation, the matrices M1, M2, . . . MT correspond to a transpose of a horizontally replicated CLDPC code (e.g., the matrices M1, M2, . . . MT may be vertically replicated instead of horizontally replicated as in a horizontally replicated CLDPC code).

The first portion 144 may include a first number of columns, and the second portion 148 may include a second number of columns. The second number may be selected based on the first number. For example, the second number may correspond to a "remainder" or a "tail" that is determined after construction of the first portion 144. Each copy of the first sub-matrix 152 may correspond to a systematic sub-code (e.g., each copy of the first sub-matrix 152 may include an information portion and a parity portion). A variable node degree associated with the first portion 144 may be equal to a variable node degree associated with the second portion 148. The second portion 148 may have a diagonal configuration.

The parity check matrix 200 also includes zero values, such as an upper right corner of zero values 190. The upper right corner of zero values 190 may enable a first set of values of the codeword 108 to be decodable independently of a second set of values of the codeword 108 (e.g., if the first set of values does not participate in parity check equations associated with the second set of values).

Figure 3:
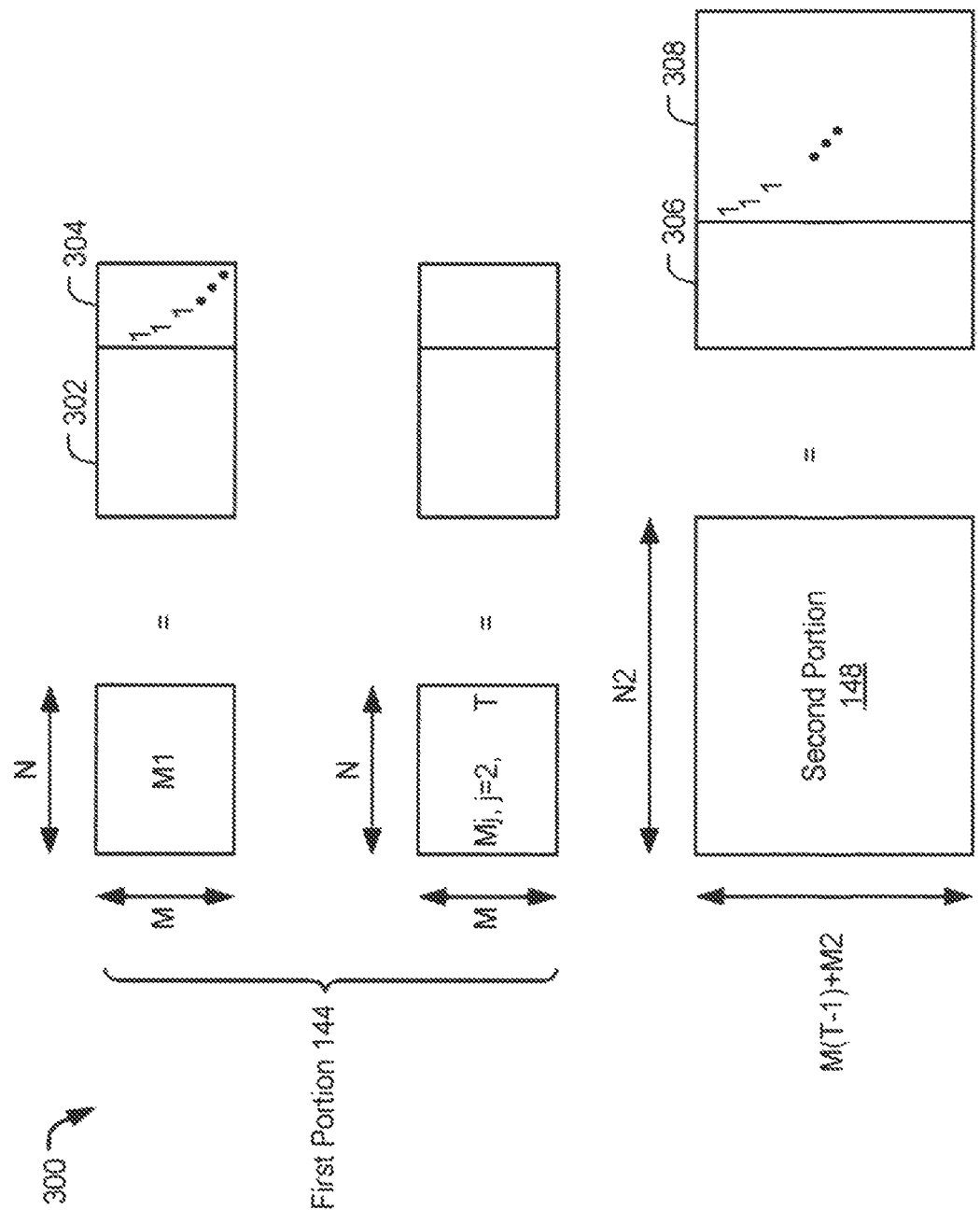
FIG. 3 is another diagram illustrating particular aspects of an example of a parity check matrix corresponding to a CLDPC code.

Referring to FIG. 3, an illustrative example of a parity check matrix is depicted and generally designated 300. The parity check matrix 300 may correspond to the parity check matrix 142 of FIG. 1. The parity check matrix 300 includes the first portion 144 (illustrated in FIG. 3 as M1 . . . Mj, where j=T) and the second portion 148.

In FIG. 3, each matrix of the first portion 144 includes N columns and M rows, where N and M are positive integers. The second portion 148 may include N2 columns and M(T−1)+M2 rows, where N2 and M2 are positive integers. Each matrix of the first portion 144 may include an information portion 302 and a parity portion 304. The second portion 148 may include an information portion 306 and a parity portion 308.

Each copy of the first sub-matrix 152 may include multiple portions, and at least one of the multiple portions may have a diagonal configuration. As used herein, a lower triangular configuration may refer to a set of matrix entries in which most entries above a main diagonal are zero. Parity portions (e.g., the parity portions 304 and 308) of the parity check matrix 300 may have a lower triangular configuration. The second portion 148 may increase encodeability of the parity check matrix 300 (e.g., by ensuring that the parity check matrix 300 has a lower triangular configuration).

The first portion 144 may include a first group of columns associated with data, a second group of columns associated with parity, and a third group of columns associated with data. For example, the first portion 144 may include a first group of columns associated with data (e.g., columns of the information portion 302), a second group of columns associated with parity (e.g., columns of the parity portion 304), and a third group of columns associated data (e.g., columns of an information portion of another copy of the first sub-matrix 152). The first group may be adjacent to the second group, and the second group may be adjacent to the third group. In some implementations, a pattern of data and parity (e.g., a pattern of data, parity, data, parity, etc.) is repeated for the remainder of the first portion.

FIG. 3 also illustrates that the first portion 144 may be sub-divided into T matrices, each with M rows and N columns. The M rightmost columns of the first portion 144 may include a diagonalized (e.g., lower triangular) section. The second portion 148 may include M*(T−1)+M2 rows (where M2<=M) and may further include N2 columns (where N2<=N). Thus, in an illustrative example, the second portion 148 may include at most the same number of rows and columns as a copy of the first sub-matrix 152. The rightmost M*(T−1)+M2 columns of the second portion 148 may include a diagonalized (e.g., lower triangular) section. In this case, the main diagonal of the parity check matrix 300 may include a sequence of lower triangular sections (of size M) and a "final" lower triangular section of size M*(T−1)+ M2. This sequence of lower triangular sections may enable efficient encoding of the data 160, such as by placing parity bits in indices corresponding to the lower triangular sections (e.g., so that the parity is "scattered" along the codeword 108).

Figure 4:
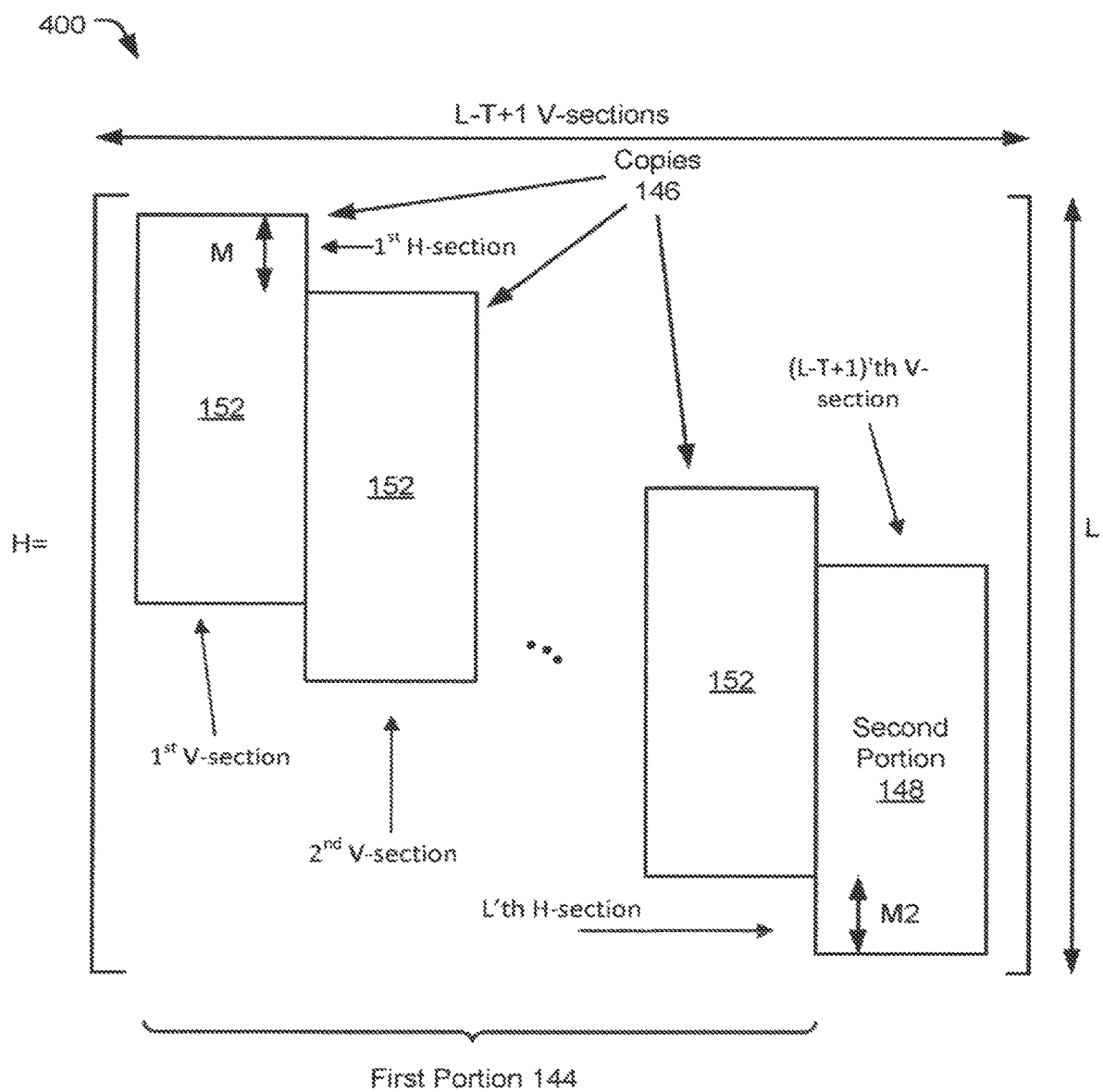
FIG. 4 is another diagram illustrating particular aspects of an example of a parity check matrix corresponding to a CLDPC code.

Referring to FIG. 4, an illustrative example of a parity check matrix is depicted and generally designated 400. The parity check matrix 400 may correspond to the parity check matrix 142 of FIG. 1. The parity check matrix 400 includes the first portion 144 (illustrated in FIG. 4 as a plurality of copies of the first sub-matrix 152) and the second portion 148.

The parity check matrix 400 includes multiple horizontal sections (h-sections) and multiple vertical sections (v-sections). In the example of FIG. 4, the parity check matrix 400 includes L−T+1 v-sections and also includes L h-sections.

In an illustrative example, a process to generate a CLDPC code includes determining a set of parameters, such as M, M2, N, N2, L, and Z, based on a target information and parity length. M may indicate a number of checks per h-section (excluding the last h-section), M2 may indicate a number of checks of the last h-section (where M2<=M), N may indicate a number of variables per v-section (excluding the last v-section), and N2 may indicate a number of variables of the last v-section (where N2<=N). L may indicate a number of the h-sections, SP may indicate a spreading pattern, and Z may indicate a lifting factor. After determining the set of parameters, the process may include generating protographs (e.g., where Z=1) with varying variable node degrees (e.g. 4, 5, and 6) and varying SP values. After generating the protographs, the process may include identifying a subset of the set of parameters that increases a density evolution decoding threshold using EXIT charts.

A parity check matrix in accordance with the disclosure may have a constant variable degree (dv) that is spread over the smaller matrices in a column M1, M2, . . . MT. The spreading pattern (SP) may be a vector of length T, where the ith element includes the dv of Mi. After determining the spreading pattern, the portions 144, 148 may be constructed. For example, the spreading pattern may be 3,1,1,1 with dv=6 for all columns (v-sections).

A first copy of the plurality of copies 146 may extend from a first row of the parity check matrix 400 to a second row of the parity check matrix 400, a second copy of the plurality of copies 146 may span from a third row to a fourth row of the parity check matrix 400, and the third row may lie between the first and second rows. Vertical offsets of the copies of the first sub-matrix 152 may be identical, and horizontal offsets of copies of the first sub-matrix 152 may be identical. A variable node degree associated with the first portion 144 may be equal to a variable node degree associated with the second portion 148.

Figure 5:
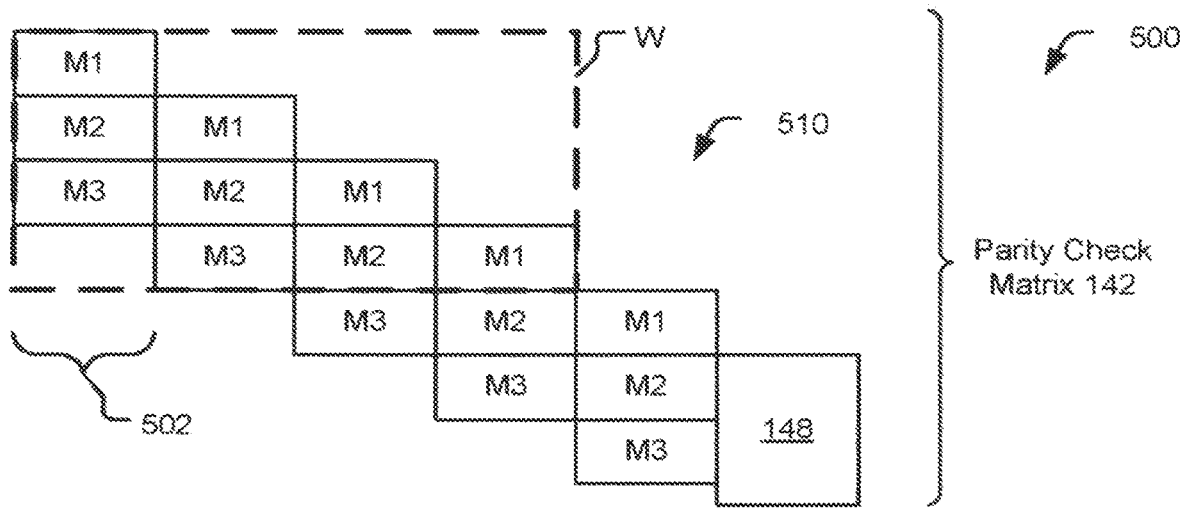
FIG. 5 is a diagram illustrating particular aspects of an example of a forward windowed decoding process associated with a CLDPC code.
Figure 5:
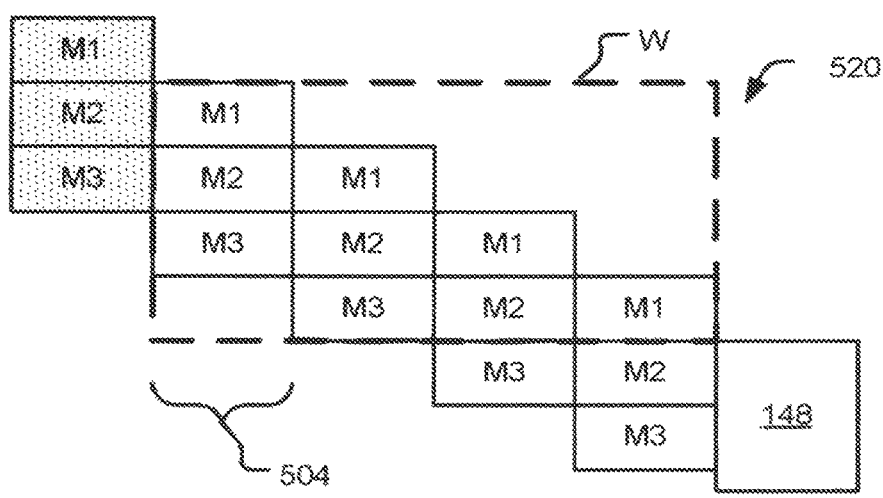
Figure 5:
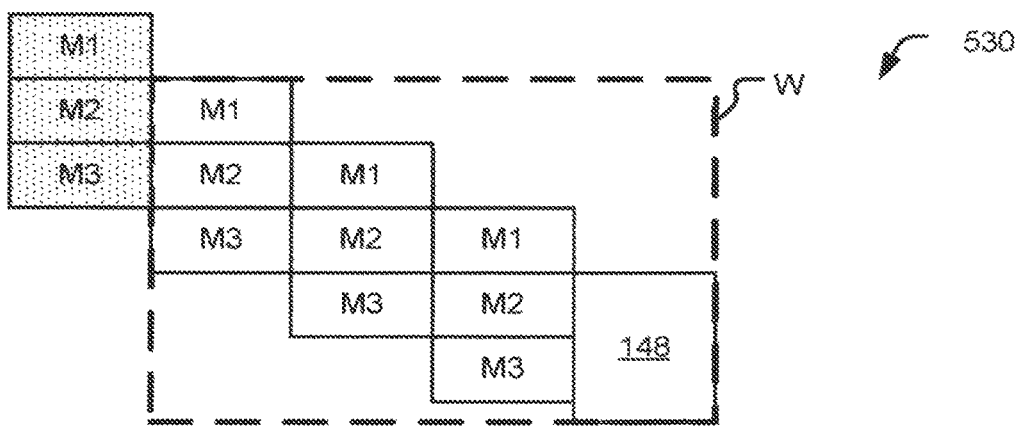

FIG. 5 illustrates an example of a forward windowed decoding process 500. The forward windowed decoding process 500 may include adjusting (e.g., moving or "sliding") a position of a window W relative to the parity check matrix 142. For example, the window W may be adjusted to select a second set of target variables 504 after processing based on a first set of target variables 502. The first set of target variables 502 may be processed during a first set of one or more clock cycles of the ECC engine 132, and the second set of target variables 504 may be processed during a second set of one or more clock cycles of the ECC engine 132. The window W may correspond to the first window W1, the second window W2, the third window W3, or another window.

A window (e.g., the window W) may span a subset of rows and columns of a parity check matrix that corresponds to a CLDPC code. For example, FIG. 5 illustrates a CLDPC code with T=3 and a decoding window size of 4. In FIG. 5, a window boundary of the window W is indicated by a dashed line. During a particular clock cycle of an illustrative decoding process, a decoder (e.g., any of the decoders 136, 138, and 140) may process only the symbols within the window W. For example, at 510, the decoder may decode the first set of target variables 502.

After decoding the first set of target variables 502, the decoder may shift the window W (e.g., "down" and "right" by one section) to proceed and decode the next window, at 520. The forward windowed decoding process 500 may continue until the last decoding window, at 530, in which the decoder may attempt to correct all errors (and not just those within the first v-section of the last decoding window).

In an illustrative example, convergence of decoding of target variables is detected based on determining that a threshold number of one or more of the respective parity checks within the window is satisfied. The threshold may be set relatively low to increase probability of convergence, or the threshold may be set higher to reduce probability of non-convergence due to one or more undetected errors.

Figure 6:
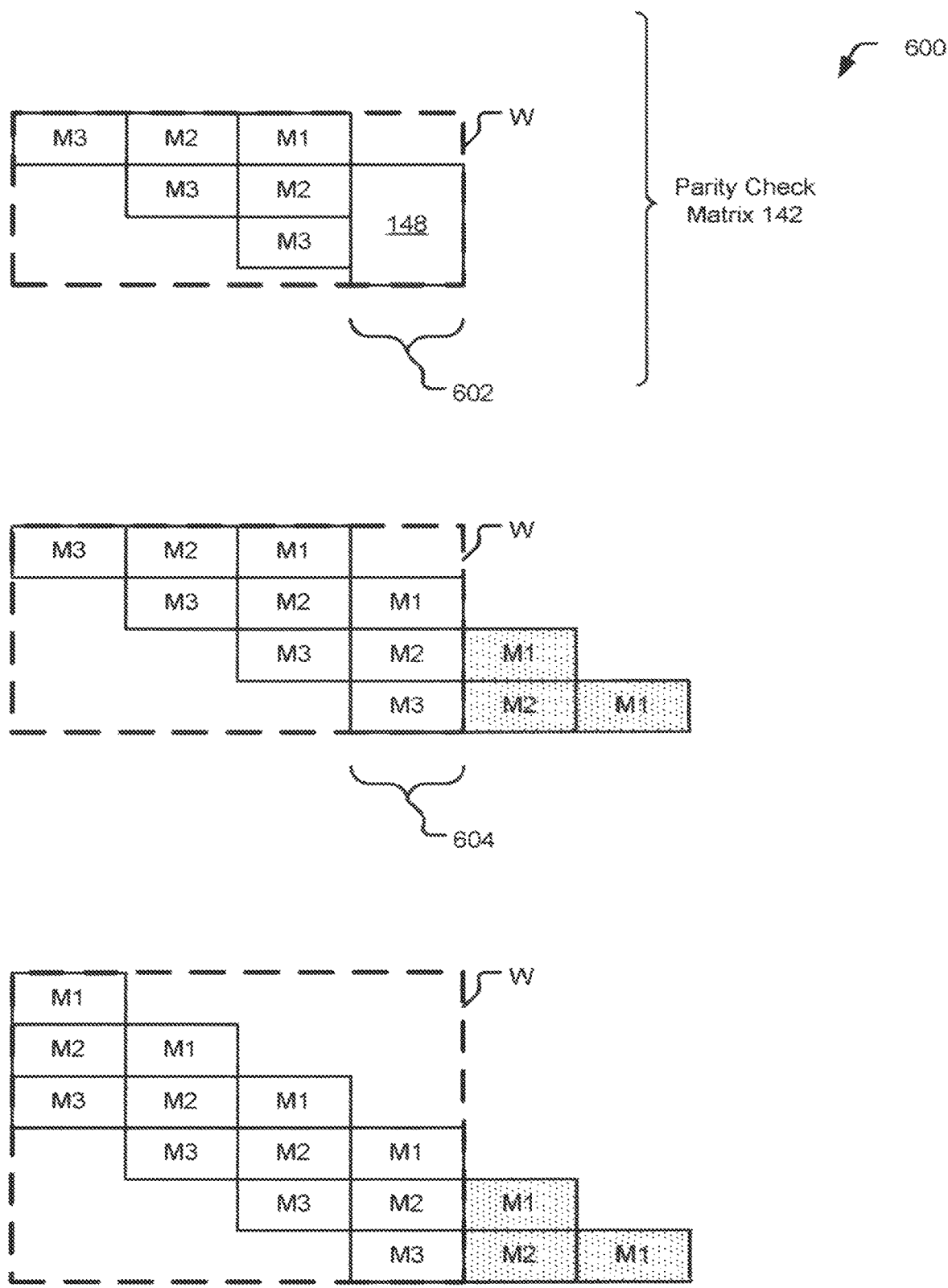
FIG. 6 is another diagram illustrating particular aspects of an example of a reverse windowed decoding process associated with a CLDPC code.

FIG. 6 illustrates another example of a reverse windowed decoding process 600. The reverse windowed decoding process 600 may include adjusting (e.g., moving or "sliding") a position of a window W relative to the parity check matrix 142. In the example of FIG. 6, the window W may be adjusted leftward (e.g., from rows and columns associated with greater indices to rows and columns associated with lower indices). For example, the window W may be adjusted to select a second set of target variables 604 processing based on a first set of target variables 602. The first set of target variables 602 may be processed during a first set of one or more clock cycles of the ECC engine 132, and the second set of target variables 604 may be processed during a second set of one or more clock cycles of the ECC engine 132. The window W may correspond to the first window W1, the second window W2, the third window W3, or another window.

In another windowed decoding process, a window may be moved "outside in" relative to the parity check matrix 142. For example, an "outside in" windowed decoding process may including adjusting a window from a leftmost set of columns to a rightmost set of columns and then to a next leftmost set of columns, etc. (e.g., so that the window advances from the ends of the parity check matrix 142 to the middle of the parity check matrix 142). In another example, the reverse windowed decoding process 600 may be used in conjunction with a forward windowed decoding process (e.g., the forward windowed decoding process 500) either to propagate extrinsic information in the event of decoding failure in a specific window, to speed up decoding, or both.

A windowed decoding process (e.g., a forward windowed decoding process, a reverse windowed decoding process, or an "outside in" windowed decoding process) may be performed to increase decoding throughput by processing portions of data (e.g., the representation 124 of the codeword 108) in parallel using multiple windows (e.g., the first window W1, the second window W2, and the third window W3). In some implementations the windows W1, W2, and W3 have different sizes. In other implementations, two or more windows may have a common size.

According to an illustrative example of a windowed decoding process, multiple columns of a parity check matrix may be processed in parallel such that no row of the parity check matrix is included in multiple windows simultaneously (or that no row is touched by multiple columns processed at the same time). According to a second example of a windowed decoding process, multiple v-sections of a parity check matrix may be processed in parallel if the multiple v-sections do not intersect entirely. To illustrate, if T=3, the second example may process v-sections having indices 1, 4, and 7 in parallel, may then process v-sections having indices 2, 5, and 8 in parallel, and then may process v-sections having indices 3, 6, and 9 in parallel (e.g., to conclude a decoding iteration of the windowed decoding process).

In some implementations, a window may have a non-uniform profile of variable node degree. For example, variables within the left section or sections of a window may have a greater variable node degree, and the variable node degree may decrease towards the end (or right) of the window. In this case, error correction capability may reduce (or "degrade") toward the right of the window. A spreading pattern (SP) may be used to determine (or control) an amount of the "degradation" of the error correction capability. For example, in some implementations, SP(1)=1 may correspond to a "weak" error correction capability. In other implementations, a relatively large value of SP(1) may weaken connectivity of the CLDPC chain and may reduce information transfer between decoding iterations associated with consecutive windows. In some implementations, SP=[2 1 1] (resulting in a variable node degree of four), SP=[3 1 1] (resulting in a variable node degree of five), or SP=[3 1 1 1] (resulting in a variable node degree of six).

Assuming decoding success for a particular window, values of the target variables may be determined, and upon transitioning to the next window, the values affect the satisfiability condition of neighboring checks (checks that neighbor the target variables) within the next window. As an example, consider the first two sections of the decoding window illustrated in the middle section of FIG. 5, at 520. Whether these checks need to be satisfied to a '0' or '1' value depends on the values of the variables decoded in the previous window, at 510. In some implementations, a size of a window is different than the value of T.

Upon successful decoding associated with a window, the subsequent window may start with the output values of the window for variables that were not target symbols of the current window. For example, upon successful decoding at 510 of FIG. 5, decoding may move from the first set of target variables 502 to the second set of target variables 504. This may save decoding time, since if a current window has been decoded successfully, then the remaining variables (which were not target symbols of the current window) have been partially corrected and are with high probability closer to being "correct." In connection with the illustrative three-decoder scheme of FIG. 1, in the event of decoding failure by the first decoder 136, one or more windows may be successfully decoded by the second decoder 138. In this case, a subsequent window may be decoded by the first decoder 136 (to reduce power consumption as compared to decoding of the subsequent window by the second decoder 138). Alternatively or in addition, in the event of decoding failure by the second decoder 138, one or more windows may be successfully decoded by the third decoder 140, and a subsequent window may be decoded by the second decoder 138 (to reduce power consumption as compared to decoding of the subsequent window by the third decoder 140). Thus, a "stronger" decoder (e.g., the second decoder 138 or the third decoder 140) may initialize data for a "weaker" decoder (e.g., the first decoder 136 or the second decoder 138, respectively).

Alternatively or in addition, a different window size may be assigned per type of decoder. For example, a largest window size may be selected for a decoder associated with a lowest power consumption (e.g., the first decoder 136), and a smallest window size be selected for a decoder associated with a highest power consumption (e.g., third decoder 140). Thus, performance of the first decoder 136 may be determined based on a window size of the first decoder 136, and the third decoder 140 may be associated with a tradeoff between obtaining better correction capability (by increasing the window size) and lower cost (by decreasing the window size). Thus, decoder performance may be decoupled from an error correction capability/cost tradeoff.

Figure 7:
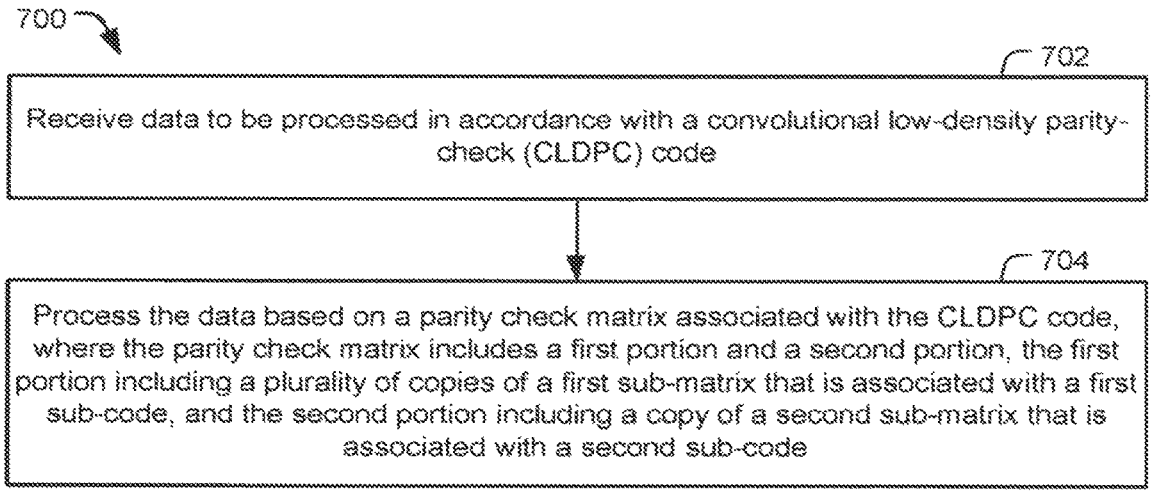
FIG. 7 is a flow chart of an illustrative example of a method of processing data based on a CLDPC code.

Referring to FIG. 7, a particular illustrative example of a method is depicted and generally designated 700. The method 700 may be performed at a device, such as at the data storage device 102 of FIG. 1.

The method 700 includes receiving data to be processed in accordance with a CLDPC code, at 702. For example, the data storage device 102 may receive the data 160 from the device 180. As another example, the controller 130 may receive the representation 124 of the codeword 108 from the memory device 103.

The method 700 further includes processing the data based on a parity check matrix (e.g., the parity check matrix 142) associated with the CLDPC code, at 704. The parity check matrix includes a first portion (e.g., the first portion 144) and a second portion (e.g., the second portion 148). The first portion includes a plurality of copies (e.g., the plurality of copies 146) of a first sub-matrix (e.g., the first sub-matrix 152) that is associated with a first sub-code, and the second portion includes a copy of a second sub-matrix (e.g., the second sub-matrix 156) that is associated with a second sub-code. In an illustrative example, processing the data includes encoding the data to generate a codeword, such as the codeword 108. In another example, processing the data includes decoding the data, such as by decoding the representation 124 of the codeword 108 to generate the data 160.

Figure 8:
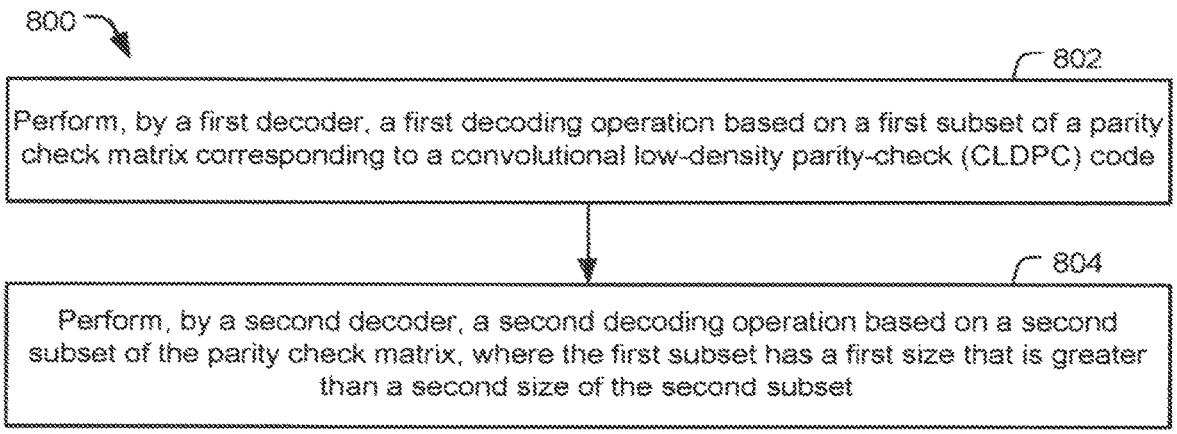
FIG. 8 is a flow chart of another illustrative example of a method of processing data based on a CLDPC code.

Referring to FIG. 8, a particular illustrative example of a method is depicted and generally designated 800. The method 800 may be performed at a device, such as at the data storage device 102 of FIG. 1.

The method 800 includes performing, by a first decoder, a first decoding operation based on a first subset of a parity check matrix corresponding to a CLDPC code, at 802. For example, the first decoder may correspond to the first decoder 136, the first subset may correspond to the first window W1, and the parity check matrix may correspond to the parity check matrix 142.

The method 800 further includes performing, by a second decoder, a second decoding operation based on a second subset of the parity check matrix, at 804. The first subset has a first size that is greater than a second size of the second subset. To illustrate, the second decoder may correspond to the second decoder 138, the second subset may correspond to the second window W2, and a first size of the first window W1 may be greater than a second size of the second window W2.

Figure 9:
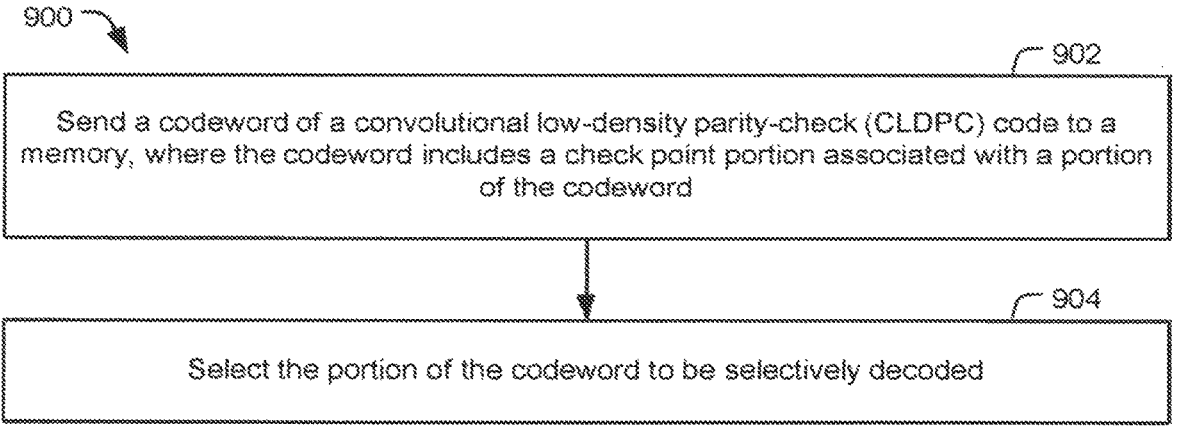
FIG. 9 is a flow chart of an illustrative example of a method of accessing data associated with a CLDPC code.

Referring to FIG. 9, a particular illustrative example of a method is depicted and generally designated 900. The method 900 may be performed at a device, such as at the data storage device 102 of FIG. 1.

The method 900 includes sending a codeword of a CLDPC code to a memory, at 902. The codeword includes a check point portion associated with a portion of the codeword. For example, the codeword 108 may include the first check point portion 114 (e.g., error correcting information) associated with the header 110 and the first data portion 112.

The method 900 may also include selecting the portion of the codeword to be selectively decoded, at 904. As an example, the controller 130 may selectively decode the header 110 and the first data portion 112 using the first check point portion 114 (e.g., without decoding one or more other portions of the codeword). Further, the controller 130 may provide decoded data corresponding to the portion to the device 180 without providing one or more other portions of the codeword to the device 180, prior to receiving one or more other portion of the codeword from the memory, or both.

Figure 10:
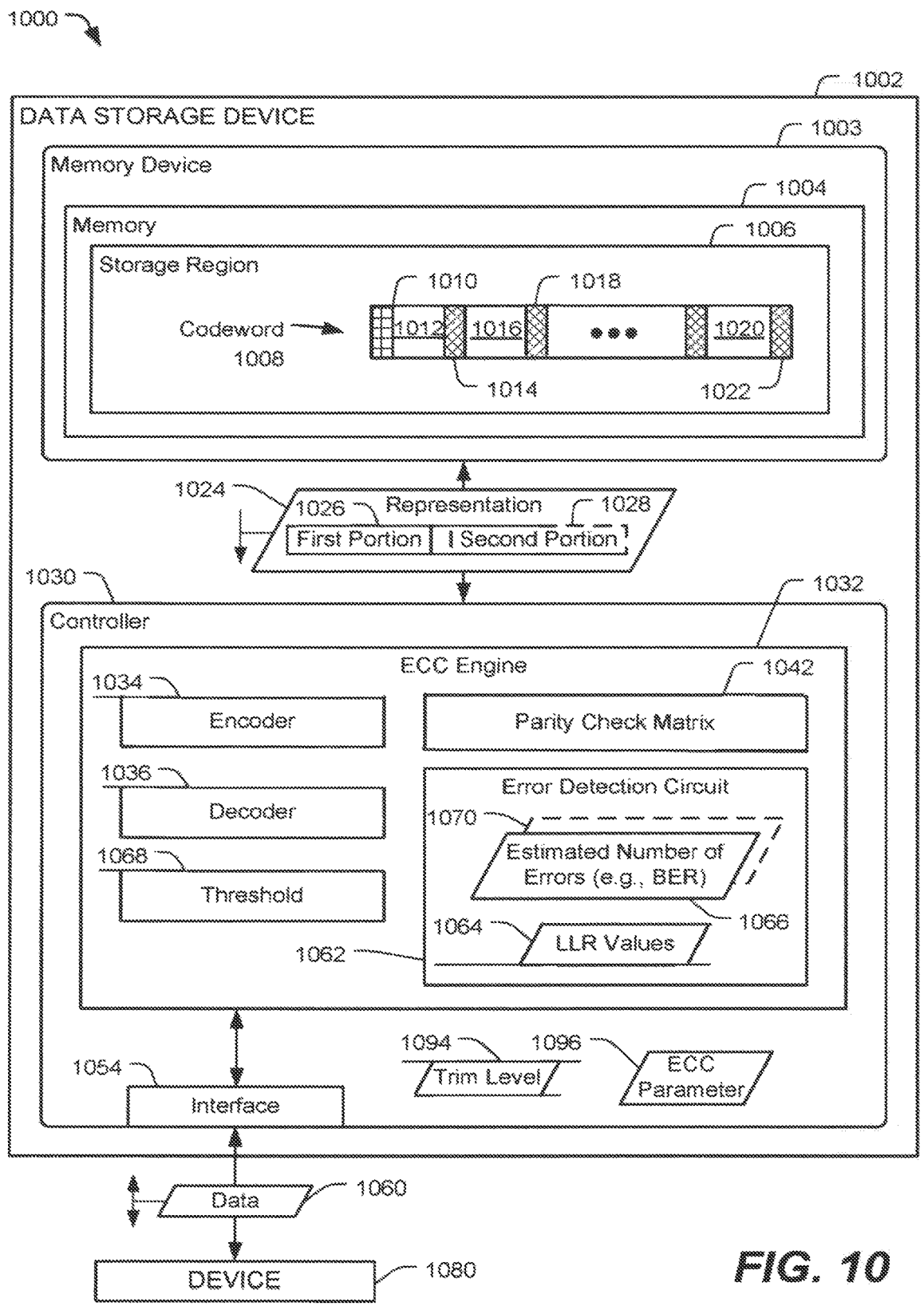
FIG. 10 is a diagram of another particular illustrative example of a system including a data storage device that is configured to operate based on a CLDPC code.

Referring to FIG. 10, a particular illustrative example of system is depicted and generally designated 1000. The system 1000 includes a data storage device 1002 and a device 1080 (e.g., a host device or an access device). The data storage device 1002 includes a memory device 1003 and a controller 1030. The controller 1030 is coupled to the memory device 1003. In some examples, the system 1000 corresponds to the system 100, the data storage device 1002 corresponds to the data storage device 102, and the device 1080 corresponds to the device 180. The memory device 1003 may correspond to the memory device 103, and the controller 1030 may correspond to the controller 130.

The memory device 1003 includes a memory 1004, such as a non-volatile array of storage elements included in one or more memory dies. The memory 1004 may include a flash memory (e.g., a NAND flash memory) or a resistive memory, such as a resistive random access memory (ReRAM), as illustrative examples. The memory 1004 may correspond to the memory 104, as an illustrative example.

The memory 1004 includes one or more regions of storage elements, such as a storage region 1006 (e.g., the storage region 106). An example of the storage region 1006 is a block, such as a NAND flash erase group of storage elements, or a group of resistance-based storage elements in a ReRAM implementation. Another example of the storage region 1006 is a word line of storage elements (e.g., a word line of NAND flash storage elements or a word line of resistance-based storage elements). The storage region 1006 may have a single-level-cell (SLC) configuration, a multi-level-cell (MLC) configuration, or a tri-level-cell (TLC) configuration, as illustrative examples. Each storage element of the storage region 1006 may be programmable to a state (e.g., a threshold voltage in a flash configuration or a resistive state in a resistive memory configuration) that indicates one or more values. As an example, in an illustrative TLC scheme, a storage element of the storage region 1006 may be programmable to a state that indicates three values. As an additional example, in an illustrative MLC scheme, a storage element of the storage region 1006 may be programmable to a state that indicates two values.

The controller 1030 may include an interface 1054, such as a host interface or an access device interface. The interface 1054 is configured to receive data 1060 from the device 1080 in connection with a request for write access to the memory 1004. The interface 1054 is configured to provide the data 1060 to the device 1080 in connection with a request for read access to the memory 1004.

The controller 1030 may further include an error correcting code (ECC) engine 1032 (e.g., the ECC engine 132). The ECC engine 1032 may include an encoder 1034 (e.g., the encoder 134), a decoder 1036 (e.g., one or more of the decoders 136, 138, and 140), and an error detection circuit 1062. The decoder 1036 may be coupled to the error detection circuit 1062.

The ECC engine 1032 is configured to operate based on a convolutional low-density parity-check (CLDPC) code. For example, the ECC engine 1032 may be configured to process the data 1060 based on a parity check matrix 1042 (e.g., the parity check matrix 142) associated with a CLDPC code. The parity check matrix 1042 may include the first portion 144 and the second portion 148 of FIG. 1. The parity check matrix 1042 may have an upper right corner of zero values. For example, the parity check matrix 1042 may include the upper right corner of zero values 190 of FIG. 2.

During operation, the controller 1030 may receive the data 1060 from the device 1080. The controller 1030 may process the data 1060 in accordance with a CLDPC code. For example, controller 1030 may input the data 1060 to the ECC engine 1032 to be encoded by the encoder 1034 to generate one or more codewords associated with the CLDPC code, such as a codeword 1008 (e.g., the codeword 108). The codeword 1008 may be a CLDPC codeword. The encoder 1034 may be configured to encode the data 1060 based on the parity check matrix 1042 or based on another matrix that is associated with the parity check matrix 1042 (e.g., using a generator matrix that is based on the parity check matrix 1042).

In some implementations, the encoder 1034 is configured to insert one or more check point portions in the codeword 1008 during an encoding process. For example, the encoder 1034 may be configured to insert a first check point portion 1014 between a first data portion 1012 and a second data portion 1016. As another example, the encoder 1034 may be configured to insert a second check point portion 1018 between the second data portion 1016 and a third data portion 1020. As an additional example, the encoder 1034 may be configured to insert a third check point portion 1022 after the third data portion 1020. FIG. 10 also depicts that the codeword 1008 may include metadata, such as a header 1010. In some examples, the data portions 1012, 1016, and 1020, the check point portions 1014, 1018, and 1022, and the header 1010 correspond to the data portions 112, 116, and 120, the check point portions 114, 118, and 122, and the header 110 of FIG. 1, respectively.

In an illustrative example, the first check point portion 1014 includes first error correcting information (or first error detecting information), such as a first cyclic redundancy check (CRC) associated with the header 1010 and the first data portion 1012. The second check point portion 1018 may include second error correcting information (or second error detecting information), such as a second CRC associated with the second data portion 1016. The third check point portion 1022 may include third error correcting information, such as a third CRC associated with the third data portion 1020.

The controller 1030 is configured to send the codeword 1008 to the memory device 1003 to be stored at the memory 1004. The memory 1004 is configured to store the codeword 1008. To illustrate, the controller 1030 may send a write command to cause the memory device 1003 to store the codeword 1008 to the storage region 1006. In an illustrative example of a multiple-bits-per-cell configuration (e.g., an MLC configuration or a TLC configuration), a fold operation may be performed to write the codeword 1008 and one or more other codewords to the storage region 1006, such as by "folding" multiple codewords into a word line group of storage elements included in the storage region 1006.

The controller 1030 is configured to access a representation 1024 of at least a portion of the codeword 1008, such as by sending a read command to the memory device 1003. As an example, the controller 1030 may cause the memory device 1003 to access the representation 1024 in connection with a management operation, such as memory management operation (e.g., to determine a pass or fail status of a write operation to write the codeword 1008 to the storage region 1006, such as a fold operation, as an illustrative example) or a health management operation (e.g., to determine an amount of "wear" at the storage region 1006 as a result of program/erase cycles (PECs) at the storage region 1006, as an illustrative example). As another example, the controller 1030 may cause the memory device 1003 to access the representation 1024 in response to a request for read access from the device 1080.

The representation 1024 may correspond to a version of the codeword 1008 that differs from the codeword 1008 due to one or more errors. The representation 1024 includes a first portion 1026. For example, the first portion 1026 may correspond to a representation of one or more of the header 1010, the first data portion 1012, or the first check point portion 1014. As another example, the first portion 1026 may correspond to a representation of one or more of the second data portion 1016 or the second check point portion 1018. As an additional example, the first portion 1026 may correspond to a representation of one or more of the third data portion 1020 or the third check point portion 1022.

The first portion 1026 may include a subset of bits of the codeword 1008. To illustrate, the first portion 1026 may include a first number of bits, and the codeword 1008 may include a second number of bits that is greater than the first number of bits.

The memory device 1003 may provide the representation 1024 to the controller 1030. The controller 1030 is configured to receive the representation 1024 from the memory device 1003 and to input the representation 1024 (or the first portion 1026 of the representation 1024) to the error detection circuit 1062.

The error detection circuit 1062 is configured to determine an estimated number of errors 1066 associated with the first portion 1026. An example of the estimated number of errors 1066 is a syndrome weight associated with the first portion 1026. As an illustrative example, the error detection circuit 1062 may be configured to determine the estimated number of errors 1066 based on a number of unsatisfied checks associated with the first portion 1026. To further illustrate, the parity check matrix 1042 may specify a set of check equations in accordance with a CLDPC code used to generate the codeword 1008. The error detection circuit 1062 may be configured to determine a number of unsatisfied check equations based on the first portion 1026. In some implementations, determining the estimated number of errors 1066 may include determining (or estimating) a bit error rate (BER) of the first portion 1026.

In at least one example, the controller 1030 is configured to initiate one or more management operations at the memory 1004 based on the estimated number of errors 1066. In some implementations, the controller 1030 is configured to compare the estimated number of errors 1066 to a threshold 1068. The controller 1030 may be configured to initiate the one or more management operations in response to determining that the estimated number of errors 1066 satisfies the threshold 1068 (e.g., if the estimated number of errors 1066 is greater than or is greater than or equal to the threshold 1068).

The one or more management operations may include a memory management operation associated with the storage region 1006. An example of a memory management operation is a read scrub operation targeting the storage region 1006. To illustrate, in response to determining that the estimated number of errors 1066 satisfies the threshold 1068, the controller 1030 may read a representation of the codeword 1008 (e.g., the representation 1024 or another representation) and may error correct the representation using the decoder 1036 to generate an error corrected version of the codeword 1008. The read scrub operation may also include reprogramming the error corrected version of the codeword 1008 to the memory 1004. For example, the error corrected version of the codeword 1008 may be reprogrammed to another storage region of the memory 1004 (e.g., in connection with a NAND flash implementation of the memory 1004, as an illustrative example). In other implementations, the error corrected version of the codeword 1008 may be reprogrammed to the storage region 1006 (e.g., using a "write in place" operation in connection with a resistive memory implementation of the memory 1004, as an illustrative example).

Another example of a memory management operation is detecting a status of a write operation to write the codeword 1008 to the storage region 1006. To illustrate, if the storage region 1006 has a multiple-bits-per-cell configuration (e.g., an MLC configuration or a TLC configuration), a fold operation may be performed to write the codeword 1008 and one or more other codewords to the storage region 1006. In this case, the memory management operation may include detecting a status (e.g., detecting success or failure) of the fold operation based on the estimated number of errors 1066 satisfying the threshold 1068. In an illustrative example, the controller 1030 is configured to initiate an enhanced post-write read (EPWR) operation in response to initiating a fold operation at the memory 1004. In this case, the representation 1024 may be sensed in connection with the EPWR operation.

Alternatively or in addition, detecting the status of the write operation may include determining whether a write abort occurred during programming of the codeword 1008 to the storage region 1006. To illustrate, if a power down event or a power failure event occurs during a write operation to program the codeword 1008 to the storage region 1006, the first portion 1026 may include a relatively large number of errors. In this case, the memory management operation may include detecting a status (e.g., detecting success or failure) of the write operation based on the estimated number of errors 1066 satisfying the threshold 1068.

In response to detecting the status of the write operation based on the estimated number of errors 1066 satisfying the threshold 1068, the memory management operation may further include reprogramming the codeword 1008 at the memory 1004. For example, the controller 1030 may reprogram the codeword 1008 in response to detecting failure of the write operation (e.g., based on detecting failure of a fold operation or in response to detecting a write abort). To illustrate, the controller 1030 may sense and error correct (using the decoder 1036) a representation of the codeword 1008 and may reprogram an error corrected version of the codeword 1008 to the memory 1004. In some implementations, the error corrected version of the codeword 1008 may be reprogrammed to another storage region (e.g., in connection with a NAND flash implementation of the memory 1004, as an illustrative example). In other implementations, the error corrected version of the codeword 1008 may be reprogrammed to the storage region 1006 (e.g., using a "write in place" operation in connection with a resistive memory implementation of the memory 1004, as an illustrative example).

Alternatively or in addition to a memory management operation, the one or more management operations may include a health management operation associated with the storage region 1006, another management operation, or a combination thereof. An example of a health management operation is adjusting a trim level 1094 associated with the storage region 1006. In some implementations, the trim level 1094 indicates one or more programming characteristics associated with write operations performed at the storage region 1006. For example, the trim level 1094 may indicate a number of programming pulses to be applied to the storage region 1006 (e.g., prior to initiating a write verification process at the storage region 1006), a voltage level of one or more programming pulses applied to the storage region 1006, a duration (or "width") of one or more programming pulses applied to the storage region 1006, one or more other programming characteristics, or a combination thereof.

In response to detecting a relatively large estimated number of errors 1066 (e.g., where the estimated number of errors 1066 satisfies the threshold 1068), the controller 1030 may adjust the trim level 1094 more "conservatively" to increase reliability of data stored at the storage region 1006. For example, the controller 1030 may adjust the trim level 1094 to increase a number of programming pulses applied at the storage region 1006, to increase a voltage level of one or more programming pulses applied at the storage region 1006, or to increase a duration of one or more programming pulses associated with the storage region 1006.

In response to detecting a relatively small estimated number of errors 1066 (e.g., where the estimated number of errors 1066 fails to satisfy the threshold 1068), the controller 1030 may adjust the trim level 1094 more "aggressively" to increase speed of write operations performed at the storage region 1006, to reduce power consumption associated with write operations performed at the storage region 1006, or both. For example, the controller 1030 may adjust the trim level 1094 to decrease a number of programming pulses applied at the storage region 1006, to decrease a voltage level of one or more programming pulses applied at the storage region 1006, or to decrease a duration of one or more programming pulses applied at the storage region 1006.

Another example of a health management operation is initiating a wear leveling operation associated with the storage region 1006. A wear leveling operation may include copying data from a less reliable (or more frequently used) storage region of the memory 1004 to a more reliable (or less frequently used) storage region of the memory 1004 (e.g., to "even out" wearing of the storage regions). An example of a wear leveling operation is an adaptive wear leveling (AWL) operation that is performed based at least in part on the estimated number of errors 1066. To illustrate, if the estimated number of errors 1066 fails to satisfy the threshold 1068, the controller 1030 may determine that the storage region 1006 is more "strong," and if the estimated number of errors 1066 satisfies the threshold 1068, the controller 1030 may determine that the storage region 1006 is more "weak." The AWL operation may specify that "stronger" storage regions of the memory 1004 are to be used more frequently than (or sooner than) "weaker" storage regions of the memory 1004. In some implementations, the controller 1030 may include a table that ranks indications of storage regions of the memory 1004 based on estimated numbers of errors. In this case, the controller 1030 may update the table to indicate that the storage region 1006 is associated with the estimated number of errors 1066. The controller 1030 may access the table in connection with the AWL operation.

Another example of a health management operation is adjusting an ECC parameter 1096 associated with the storage region 1006. For example, the ECC parameter 1096 may indicate a code rate (e.g., a ratio of data bits to a total number of bits) used to encode data written to the storage region 1006. To illustrate, if the estimated number of errors 1066 fails to satisfy the threshold 1068, the controller 1030 may increase the code rate, and if the estimated number of errors 1066 satisfies the threshold 1068, the controller 1030 may decrease the code rate.

Alternatively or in addition to initiating one or more management operations, the controller 1030 may be configured to decode the representation 1024 of the codeword 1008 based on the estimated number of errors 1066. The decoder 1036 may be configured to receive an indication of the estimated number of errors 1066 from the error detection circuit 1062 and to use the estimated number of errors 1066 during decoding of the representation 1024.

For example, the ECC engine 1032 may be configured to determine a set of log-likelihood ratio (LLR) values 1064 based on the estimated number of errors 1066 prior to initiating decoding of the representation 1024. The decoder 1036 may be configured to receive the set of LLR values 1064 from the error detection circuit 1062 and may be configured to decode the representation 1024 using the set of LLR values 1064 (e.g., in connection with a soft decode operation).

As another example, decoding the second portion may include flipping one or more bits of the representation 1024 based on the estimated number of errors 1066. To illustrate, in some implementations, the ECC engine 1032 may be configured to flip one or more bits of the representation 1024 (e.g., prior to inputting the representation 1024 to the decoder 1036) in response to detecting that one or more bit flipping thresholds are satisfied. As an example, a particular bit of the representation 1024 may be associated with a particular number of unsatisfied check equations associated with the parity check matrix 1042. If flipping the particular bit (e.g., from a "0" value to a "1" value, or vice versa) causes a threshold number of check equations to be satisfied, the ECC engine 1032 may flip the value of the particular bit. In an illustrative example, the ECC engine 1032 may use the estimated number of errors 1066 to decide a "borderline" cases (e.g., where the ECC engine 1032 determines that a probability of the bit being correct is approximately equal to a probability of the bit being incorrect). In this case, the ECC engine 1032 may flip the bit in response to the estimated number of errors 1066 satisfying the threshold 1068 or may refrain from flipping the bit in response to the estimated number of errors 1066 satisfying the threshold 1068.

The controller 1030 may be configured to determine the estimated number of errors 1066 prior to initiating a decode operation to decode the first portion 1026 or without initiating a decode operation to decode the first portion 1026. For example, the controller 1030 may initiate a management operation without accessing and decoding a "full" representation 1024 of the codeword 1008. In other cases, the controller 1030 may access and decode the "full" representation 1024 (e.g., in response to a request for read access from the device 1080). To further illustrate, the controller 130 may input the first portion 1026 to the error detection circuit 1062 to determine the estimated number of errors 1066 prior to inputting the first portion 1026 to the decoder 1036 or without inputting the first portion 1026 to the decoder 1036.

In an illustrative example, the decoder 1036 is configured to perform the decode operation using a windowed decoding technique associated with a decoding window size. The decoding window size may correspond to any of the first window W1, the second window W2, the third window W3 described with reference to FIG. 1, as illustrative examples. The first portion 1026 may have a size corresponding to a decoding window used by the decoder.

In an illustrative implementation, the controller 1030 is configured to set a size (e.g., a number of bits) of the first portion 1026. For example, a smaller size of the first portion 1026 may enable the first portion 1026 to be sensed and transferred to the controller 1030 more rapidly and/or using less power as compared to a larger size of the first portion 1026. In some cases, a smaller size of the first portion 1026 may result in a "noisier" (or less accurate) estimated number of errors 1066. A larger size of the first portion 1026 may increase accuracy of the estimated number of errors 1066 (while increasing cycles and/or power used to sense and transfer the first portion 1026 to the controller 1030). The controller 1030 may be configured to set the size based on one or more criteria, such as a power consumption mode of the data storage device 1002, as an illustrative example.

In some examples, the first portion 1026 has a leftmost position within the codeword 1008. To illustrate, the first portion 1026 may correspond to a representation of one or more of the header 1010, the first data portion 1012, or the first check point portion 1014. In other examples, the first portion 1026 has a rightmost position within the codeword 1008. To illustrate, the first portion 1026 may correspond to a representation of one or more of the third data portion 1020 or the third check point portion 1022. In other examples, the first portion 1026 is selected from a leftmost position of the codeword 1008 and from a rightmost position of the codeword 1008. In this case, the first portion 1026 may correspond to a representation of two or more of the header 1010, the first data portion 1012, the first check point portion 1014, the third data portion 1020, and the third check point portion 1022.

In some implementations, the ECC engine 1032 is configured to compare estimated numbers of errors of different portions of the representation 1024 and to perform one or more remedial operations in response to detecting that a difference between the estimated numbers of errors satisfies a threshold. To illustrate, the representation 1024 may optionally further include a second portion 1028. In an illustrative example, the first portion 1026 corresponds to a leftmost portion of the codeword 1008, and the second portion 1028 corresponds to a rightmost portion of the codeword 1008 (or vice versa).

The controller 1030 may determine a second estimated number of errors 1070 associated with the second portion 1028. For example, the controller 1030 may input the second portion 1028 to the error detection circuit 1062 to determine the second estimated number of errors 1070.

The controller 1030 may determine a difference between the estimated number of errors 1066 and the second estimated number of errors 1070. In a non-limiting illustrative example, the controller 1030 includes a comparator circuit configured to determine the difference. The controller 1030 may compare the difference to a threshold (e.g., the threshold 1068 or another threshold). The controller 1030 may be configured to cause the memory device 1003 to re-sense the representation 1024 in response to determining that the difference satisfies the threshold. For example, the controller 1030 may detect an error (e.g., a read operation error in reading the representation 1024 or a transfer error in transferring the representation 1024 from the memory device 1003 to the controller 1030) in response to determining that the difference satisfies the threshold.

One or more aspects described with reference to FIG. 10 may improve operation of a data storage device. For example, use of a CLDPC code may enable a "fast" estimation of a number of errors of a portion (e.g., the first portion 1026) of the codeword 1008. By estimating the number of errors using a fast technique, an amount of information sent from the memory 1004 to the controller 1030 may be reduced. Alternatively or in addition, efficiency of a decoding process may be improved.

Figure 11:
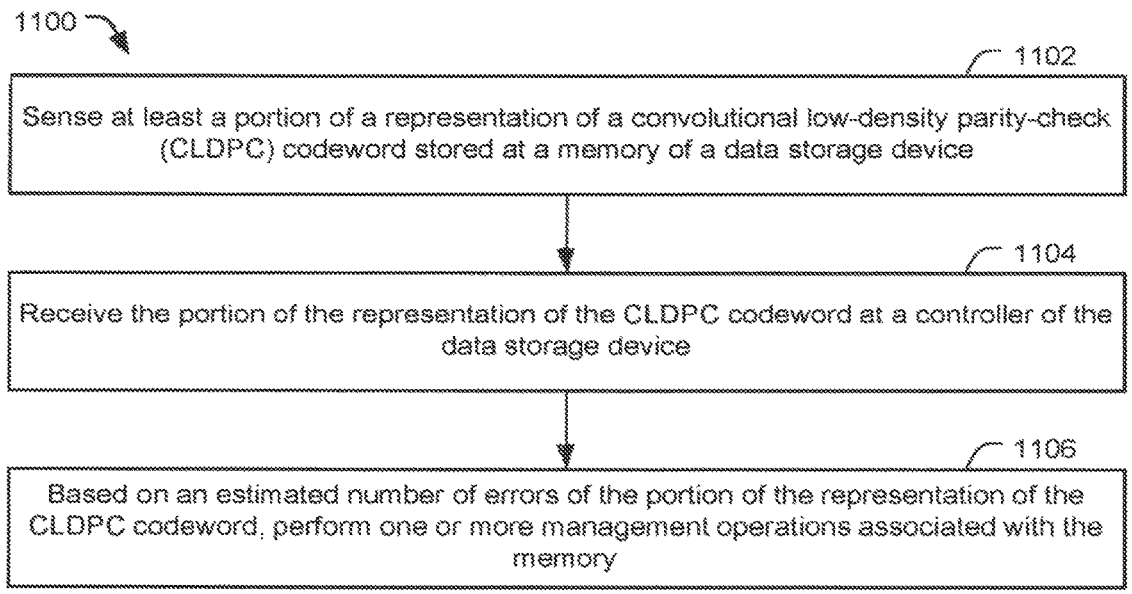
FIG. 11 is a flow chart of an illustrative example of a method of operation of a data storage device, such as the data storage device of FIG. 10.

Referring to FIG. 11, a method of operation of a data storage device is depicted and generally designated 1100. The method 1100 may be performed at the data storage device 102, the data storage device 1002, or both.

The method 1100 includes sensing at least a portion of a representation of a CLDPC codeword stored at a memory of a data storage device, at 1102. For example, the representation 1024 of the codeword 1008 may be sensed from the memory 1004 of the data storage device 1002. The representation 1024 includes the first portion 1026.

The method 1100 further includes receiving the portion of the representation of the CLDPC codeword at a controller of the data storage device, at 1104. For example, the controller 1030 may receive the representation 1024 from the memory device 1003.

The method 1100 further includes performing, based on an estimated number of errors of the portion of the representation of the CLDPC codeword, one or more management operations associated with the memory, at 1106. The estimated number of errors may correspond to the estimated number of errors 1066, and the one or more management operations may include one or more of the management operations described with reference to FIG. 10, as illustrative examples.

Figure 12:
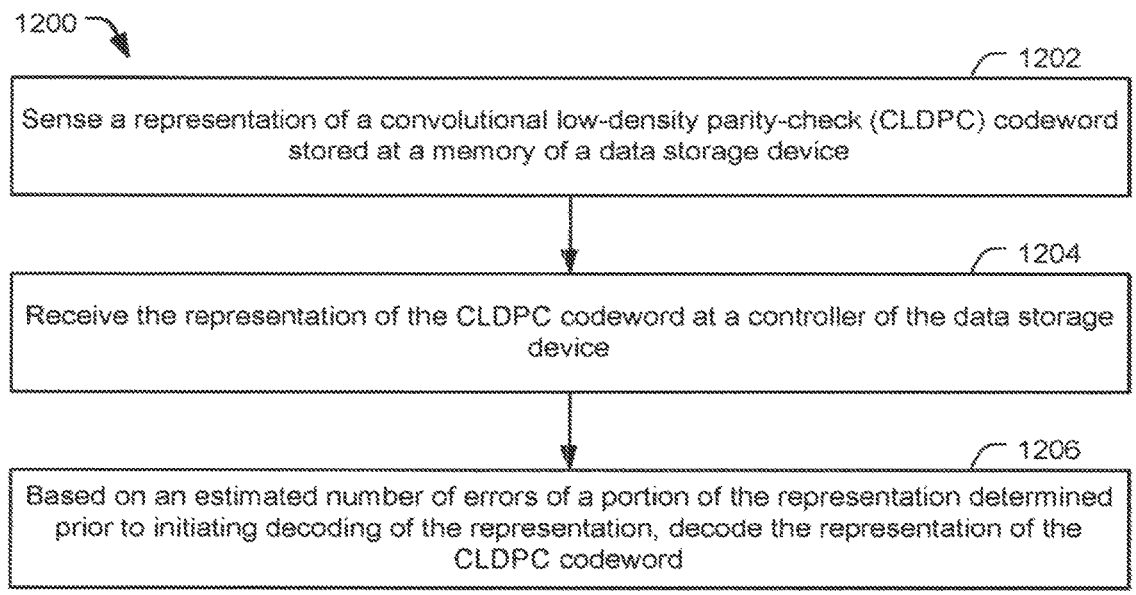
FIG. 12 is a flow chart of another illustrative example of a method of operation of a data storage device, such as the data storage device of FIG. 10.

Referring to FIG. 12, a method of operation of a data storage device is depicted and generally designated 1200. The method 1200 may be performed at the data storage device 102, the data storage device 1002, or both.

The method 1200 includes sensing a representation of a CLDPC codeword stored at a memory of a data storage device, at 1202. For example, the representation 1024 of the codeword 1008 may be sensed from the memory 1004 of the data storage device 1002. The representation 1024 includes the first portion 1026.

The method 1200 further includes receiving the representation of the CLDPC codeword at a controller of the data storage device, at 1204. For example, the controller 1030 may receive the representation 1024 from the memory device 1003.

The method 1200 further includes decoding, based on an estimated number of errors of a portion of the representation determined prior to initiating decoding of the representation, the representation of the CLDPC codeword, at 1206. The estimated number of errors may correspond to the estimated number of errors 1066, and decoding the representation may be performed in accordance with one or more techniques described with reference to FIG. 10, as illustrative examples.

Although various components depicted herein are illustrated as block components and described in general terms, such components may include one or more microprocessors, state machines, or other circuits configured to enable such components to perform one or more operations described herein. For example, one or both of the ECC engines 132, 1032 may represent physical components, such as hardware controllers, state machines, logic circuits, or other structures, to enable the controllers 130, 1030 to encode and decode data based on a CLDPC code.

Alternatively or in addition, one or both of the ECC engines 132, 1032 may be implemented using a microprocessor or microcontroller programmed to encode and decode data based on a CLDPC code. In a particular embodiment, one or both of the ECC engines 132, 1032 include a processor executing instructions (e.g., firmware) that are stored at the memories 104, 1004. Alternatively, or in addition, instructions that are executed by the processor may be stored at a separate memory location that is not part of the memories 104, 1004, such as at a read-only memory (ROM).

It should be appreciated that one or more operations described herein as being performed by the controllers 130, 1030 may be performed at the memory devices 103, 1003. As an illustrative example, in-memory ECC operations (e.g., encoding operations and/or decoding operations) may be performed at the memory devices 103, 1003 alternatively or in addition to performing such operations at the controller 130, 1030.

The data storage devices 102, 1002 may be coupled to, attached to, or embedded within one or more accessing devices, such as within a housing of the device 180 or the device 1080. For example, the data storage device 102 may be embedded within the device 180 in accordance with a Joint Electron Devices Engineering Council (JEDEC) Solid State Technology Association Universal Flash Storage (UFS) configuration. Alternatively or in addition, the data storage device 1002 may be embedded within the device 1080 in accordance with a JEDEC Solid State Technology Association UFS configuration. To further illustrate, one or both of the data storage devices 102, 1002 may be integrated within an electronic device (e.g., the device 180 or the device 1080), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, one or both of the data storage devices 102, 1002 may be implemented in a portable device configured to be selectively coupled to one or more external devices, such as a host device. For example, the data storage device 102 may be removable from the device 180 (i.e., "removably" coupled to the device 180). As an example, the data storage device 102 may be removably coupled to the device 180 in accordance with a removable universal serial bus (USB) configuration. In some implementations, the data storage device 1002 is removable from the device 1080, such as in accordance with a removable USB configuration.

The devices 180, 1080 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The devices 180, 1080 may communicate via a controller, which may enable the devices 180, 1080 to communicate with the data storage devices 102, 1002. The devices 180, 1080 may operate in compliance with a JEDEC Solid State Technology Association industry specification, such as an embedded MultiMedia Card (eMMC) specification or a Universal Flash Storage (UFS) Host Controller Interface specification. One or both of the devices 180, 1080 may operate in compliance with one or more other specifications, such as a Secure Digital (SD) Host Controller specification as an illustrative example. In another example, one or both of the devices 180, 1080 may communicate with the data storage devices 102, 1002 in accordance with another communication protocol. In some implementations, one or both of the data storage devices 102, 1002 may be integrated within a network-accessible data storage system, such as an enterprise data system, a network-attached storage (NAS) system, or a cloud data storage system, as illustrative examples.

In some implementations, one or both of the data storage devices 102, 1002 may include a solid state drive (SSD). One or both of the data storage devices 102, 1002 may function as an embedded storage drive (e.g., an embedded SSD drive of a mobile device), an enterprise storage drive (ESD), a cloud storage device, a NAS device, or a client storage device, as illustrative, non-limiting examples. In some implementations, the data storage device 102 may be coupled to the device 180 via a network. For example, the network may include a data center storage system network, an enterprise storage system network, a storage area network, a cloud storage network, a local area network (LAN), a wide area network (WAN), the Internet, and/or another network. In some implementations, the data storage device 1002 is coupled to the device 1080 via a network, such as a data center storage system network, an enterprise storage system network, a storage area network, a cloud storage network, a LAN, a WAN, the Internet, and/or another network.

To further illustrate, one or both of the data storage devices 102, 1002 may be configured to be coupled to the devices 180, 1080 as embedded memory, such as in connection with an embedded MultiMedia Card (eMMC®) (trademark of JEDEC Solid State Technology Association, Arlington, Va.) configuration, as an illustrative example. One or both of the data storage devices 102, 1002 may correspond to an eMMC device. As another example, one or both of the data storage devices 102, 1002 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). One or both of the data storage devices 102, 1002 may operate in compliance with a JEDEC industry specification. For example, one or both of the data storage devices 102, 1002 may operate in compliance with a JEDEC eMMC specification, a JEDEC UFS specification, one or more other specifications, or a combination thereof.

The memories 104, 1004 may include a resistive memory (e.g., a resistive random access memory (ReRAM), as an illustrative example), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. The memories 104, 1004 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of operation of a data storage device that includes a controller and a memory, the method comprising:
   sensing at least a portion of a representation of a convolutional low-density parity-check (CLDPC) codeword stored at a storage region of a memory of a data storage device;
   receiving the portion of the representation of the CLDPC codeword at a controller of the data storage device; and
   based on an estimated number of errors of the portion of the representation of the CLDPC codeword, performing one or more management operations associated with the storage region.

2. The method of claim 1, wherein performing the one or more management operations further includes performing one or more of a memory management operation associated with the storage region and a health management operation associated with the storage region.

3. The method of claim 2, wherein the memory management operation is performed in response to detecting that the estimated number of errors satisfies a threshold.

4. The method of claim 2, wherein performing the memory management operation includes one or more of performing a read scrub operation targeting the storage region or detecting a status of a write operation to write the CLDPC codeword to the storage region.

5. The method of claim 2, wherein the health management operation includes one or more of adjusting a trim level associated with the storage region, initiating a wear leveling operation associated with the storage region, and adjusting an error correcting code (ECC) parameter associated with the storage region.

6. The method of claim 1, further comprising determining the estimated number of errors prior to initiating a decode operation to decode the portion or without initiating the decode operation.

7. The method of claim 6, wherein the decode operation is performed based on a parity check matrix having an upper right corner of zero values.

8. The method of claim 6, wherein determining the estimated number of errors includes determining a bit error rate (BER) of the portion based on a number of unsatisfied checks associated with the portion.

9. The method of claim 1, wherein the portion includes a first number of bits, and wherein the CLDPC codeword includes a second number of bits that is greater than the first number of bits.

10. The method of claim 1, further comprising:
determining a second estimated number of errors associated with a second portion of the representation; and
determining a difference between the estimated number of errors and the second estimated number of errors.

11. The method of claim 10, further comprising re-sensing the representation of the CLDPC codeword in response to determining that the difference satisfies a threshold.

12. A data storage device comprising:
a memory configured to store a convolutional low-density parity-check (CLDPC) codeword at a storage region of the memory; and
a controller coupled to the memory, the controller configured to access at least a portion of a representation of the CLDPC codeword and to initiate one or more management operations associated with the storage region based on an estimated number of errors of the portion of the representation of the CLDPC codeword.

13. The data storage device of claim 12, further comprising an error detection circuit configured to determine the estimated number of errors based on a number of unsatisfied checks associated with the portion.

14. The data storage device of claim 12, wherein the controller includes a decoder, and wherein the controller is further configured to determine the estimated number of errors prior to inputting the portion to the decoder.

15. The data storage device of claim 14, wherein the decoder is further configured to decode the CLDPC codeword based on a parity check matrix having an upper right set of values of zero.

16. A data storage device comprising:
a memory configured to store a convolutional low-density parity-check (CLDPC) codeword at a storage region of the memory; and
a controller coupled to the memory, the controller configured to receive at least a portion of a representation of the CLDPC codeword from the memory, to initiate one or more management operations associated with the storage region based on an estimated number of errors associated with the portion of the representation of the CLDPC codeword prior to initiating decoding of the representation, and to decode the representation of the CLDPC codeword based on the estimated number of errors.

17. The data storage device of claim 16, further comprising:
an error detection circuit configured to determine the estimated number of errors; and
a decoder coupled to the error detection circuit and configured to receive an indication of the estimated number of errors from the error detection circuit.

18. The data storage device of claim 17, wherein the decoder is further configured to decode the representation based on a decoding window, and wherein the portion has a size corresponding to the decoding window.

19. The data storage device of claim 16, wherein the portion has a leftmost position within the CLDPC codeword.

20. The data storage device of claim 16, wherein the portion has a rightmost position within the CLDPC codeword.

21. The data storage device of claim 16, wherein the portion is selected from a leftmost position of the CLDPC codeword and from a rightmost position of the CLDPC codeword.

22. The method of claim 1, wherein use of the portion of the representation of the CLDPC codeword to initiate the one or more management operations reduces an amount of information transferred from the memory to the controller as compared to sending all of the representation of the CLDPC codeword from the memory to the controller.

23. The method of claim 5, wherein adjusting the trim level associated with the storage region includes adjusting one or more of a number of pulses of a programming signal used to write data to the storage region, adjusting a voltage level of the programming signal, or adjusting a duration of the programming signal.

24. The data storage device of claim 12, wherein use of the portion of the representation of the CLDPC codeword to initiate the one or more management operations reduces an amount of information transferred from the memory to the controller as compared to sending all of the representation of the CLDPC codeword from the memory to the controller.

25. The data storage device of claim 12, wherein the controller is further configured to adjust, in connection with the one or more management operations, a trim level associated with the storage region.

26. The data storage device of claim 25, wherein the controller is configured to adjust the trim level associated with the storage region by adjusting one or more of a number of pulses of a programming signal used to write data to the storage region, adjusting a voltage level of the programming signal, or adjusting a duration of the programming signal.

27. The data storage device of claim 16, wherein use of the portion of the representation of the CLDPC codeword to initiate the one or more management operations reduces an amount of information transferred from the memory to the controller as compared to sending all of the representation of the CLDPC codeword from the memory to the controller.

28. The data storage device of claim 16, wherein the controller is further configured to adjust, in connection with the one or more management operations, a trim level associated with the storage region.

29. The data storage device of claim 28, wherein the controller is configured to adjust the trim level associated with the storage region by adjusting one or more of a number of pulses of a programming signal used to write data to the storage region, adjusting a voltage level of the programming signal, or adjusting a duration of the programming signal.

* * * * *